United States Patent
Kim et al.

(10) Patent No.: US 10,930,329 B2
(45) Date of Patent: Feb. 23, 2021

(54) STORAGE DEVICE ADJUSTING A TIMING OF A DATA SIGNAL AND A DATA STROBE SIGNAL

(71) Applicant: SAMSUNG ELECTRONICS CO., LTD., Suwon-si (KR)

(72) Inventors: Hyungjin Kim, Seoul (KR); Soong-Man Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/410,370

(22) Filed: May 13, 2019

(65) Prior Publication Data
US 2020/0143854 A1   May 7, 2020

(30) Foreign Application Priority Data
Nov. 7, 2018   (KR) .................. 10-2018-0135620

(51) Int. Cl.
*G11C 7/22*  (2006.01)
*G11C 7/10*  (2006.01)
*G06F 3/06*  (2006.01)

(52) U.S. Cl.
CPC ............ *G11C 7/222* (2013.01); *G06F 3/0604* (2013.01); *G06F 3/0659* (2013.01); *G06F 3/0679* (2013.01); *G11C 7/1051* (2013.01); *G11C 7/1078* (2013.01); *G11C 7/22* (2013.01)

(58) Field of Classification Search
CPC ........ G11C 7/1051; G11C 7/1078; G11C 7/22
USPC ........................................................ 365/194
See application file for complete search history.

(56) References Cited

U.S. PATENT DOCUMENTS

| | | | |
|---|---|---|---|
| 6,940,768 B2 | 9/2005 | Dahlberg et al. | |
| 7,034,589 B2 | 4/2006 | Chao | |
| 7,443,741 B2 | 10/2008 | Butt et al. | |
| 8,111,564 B2 | 2/2012 | Fox et al. | |
| 8,311,761 B2 * | 11/2012 | Best | G06F 13/1689 |
| | | | 702/106 |
| 8,416,903 B1 | 4/2013 | Oh et al. | |
| 8,520,455 B2 * | 8/2013 | Ross | G11C 8/18 |
| | | | 365/185.18 |
| 8,605,539 B2 | 12/2013 | Haldar et al. | |
| 8,644,419 B2 | 2/2014 | Hampel et al. | |
| 8,645,743 B2 | 2/2014 | Machnicki et al. | |
| 8,780,655 B1 | 7/2014 | Kumar et al. | |
| 8,897,084 B2 | 11/2014 | Chen et al. | |
| 9,111,608 B2 | 8/2015 | Best | |

(Continued)

FOREIGN PATENT DOCUMENTS

| | | |
|---|---|---|
| JP | 2013004131 | 1/2013 |
| JP | 6179206 | 8/2017 |
| KR | 10-2014-0041207 | 4/2014 |

*Primary Examiner* — Son L Mai
(74) *Attorney, Agent, or Firm* — F. Chau & Associates, LLC

(57) ABSTRACT

A storage device includes a nonvolatile memory device, and a controller that exchanges a data signal with the nonvolatile memory device through a data input and output line and exchanges a data strobe signal with the nonvolatile memory device through a data strobe line. In a training operation, at least one of the nonvolatile memory device and the controller performs a coarse training of adjusting a delay of the data signal with a first stride and a fine training of adjusting the delay of the data signal with a second stride smaller than the first stride.

9 Claims, 17 Drawing Sheets

(56) References Cited

U.S. PATENT DOCUMENTS

| | | | |
|---|---|---|---|
| 9,147,463 B1 | 9/2015 | Sarraju et al. | |
| 9,183,125 B2 | 11/2015 | Brandl et al. | |
| 9,251,906 B1 * | 2/2016 | Jain | G11C 7/22 |
| 9,305,622 B1 | 4/2016 | Jeter | |
| 9,396,789 B2 | 7/2016 | Iwasaki | |
| 9,466,349 B1 | 10/2016 | Chung | |
| 9,514,420 B2 * | 12/2016 | Bose | G06N 20/00 |
| 9,552,865 B2 | 1/2017 | Giovannini et al. | |
| 9,571,105 B2 | 2/2017 | Kwak | |
| 9,620,184 B1 | 4/2017 | Bialas, Jr. et al. | |
| 9,640,277 B2 | 5/2017 | Bonen et al. | |
| 9,811,273 B1 * | 11/2017 | Brahmadathan | G06F 3/0619 |
| 9,971,975 B2 | 5/2018 | Rao et al. | |
| 10,325,633 B2 * | 6/2019 | Lee | G11C 7/1006 |
| 2017/0054549 A1 | 2/2017 | Stott et al. | |
| 2017/0237444 A1 | 8/2017 | Wei et al. | |

\* cited by examiner

STORAGE DEVICE ADJUSTING A TIMING OF A DATA SIGNAL AND A DATA STROBE SIGNAL

CROSS-REFERENCE TO RELATED APPLICATION

This application claims priority under 35 U.S.C. § 119 to Korean Patent Application No. 10-2018-0135620, filed on Nov. 7, 2018 in the Korean Intellectual Property Office, the disclosure of which is incorporated by reference herein in its entirety.

TECHNICAL FIELD

Exemplary embodiments of the inventive concept described herein relate to a semiconductor device, and more particularly, to a storage device which aligns, verifies, and adjusts a timing of a data signal and a timing of a data strobe signal.

DISCUSSION OF RELATED ART

In storage devices including a nonvolatile memory device and a controller, a speed at which the nonvolatile memory device and the controller exchange data signals is increasing as technologies for manufacturing semiconductor devices develop.

As the speed to exchange data signals is increased, a time when the data signals maintain information becomes short, and a margin capable of accurately identifying the data signals decreases. To accurately identify the data signals transmitted at a high speed, a training operation may adjust timings at which the nonvolatile memory device or the controller transmits the data signals.

A time taken to perform the training operation may cause reduction in operating performance of the storage device. Additionally, after the training operation is completed, due to a change in an environment, timings at which the nonvolatile memory device or the controller transmits the data signals may be changed.

SUMMARY

According to an exemplary embodiment of the inventive concept, a storage device includes a nonvolatile memory device, and a controller that exchanges a data signal with the nonvolatile memory device through a data input and output line and exchanges a data strobe signal with the nonvolatile memory device through a data strobe line. In a training operation, at least one of the nonvolatile memory device and the controller performs a coarse training of adjusting a delay of the data signal with a first stride and a fine training of adjusting the delay of the data signal with a second stride smaller than the first stride.

According to an exemplary embodiment of the inventive concept, a storage device includes a nonvolatile memory device, and a controller that exchanges data signals with the nonvolatile memory device through data input and output lines and exchanges a data strobe signal with the nonvolatile memory device through a data strobe line. In a training operation, the controller and the nonvolatile memory device align center locations of the data signals with a timing when the data strobe signal transitions. The controller stores pieces of information of boundaries of a signal having a smallest width among the data signals. After the training operation is completed, the controller verifies alignment of the center locations of the data signals with the timing when the data strobe signal transitions by using the pieces of information of the boundaries.

According to an exemplary embodiment of the inventive concept, a storage device includes a nonvolatile memory device, and a controller that exchanges a data signal with the nonvolatile memory device through a data input and output line and exchanges a data strobe signal with the nonvolatile memory device through a data strobe line. In a training operation, the controller and the nonvolatile memory device aligns a center location of the data signal with a timing when the data strobe signal transitions, by adjusting a first delay to transmit the data signal. At least one of the controller and the nonvolatile memory device adjusts a second delay of the data strobe signal based on a variation in a length of one period of the data strobe signal.

BRIEF DESCRIPTION OF THE FIGURES

The above and other objects and features of the inventive concept will become apparent by describing in detail exemplary embodiments thereof with reference to the accompanying drawings.

DETAILED DESCRIPTION OF THE EMBODIMENTS

Figure 1:
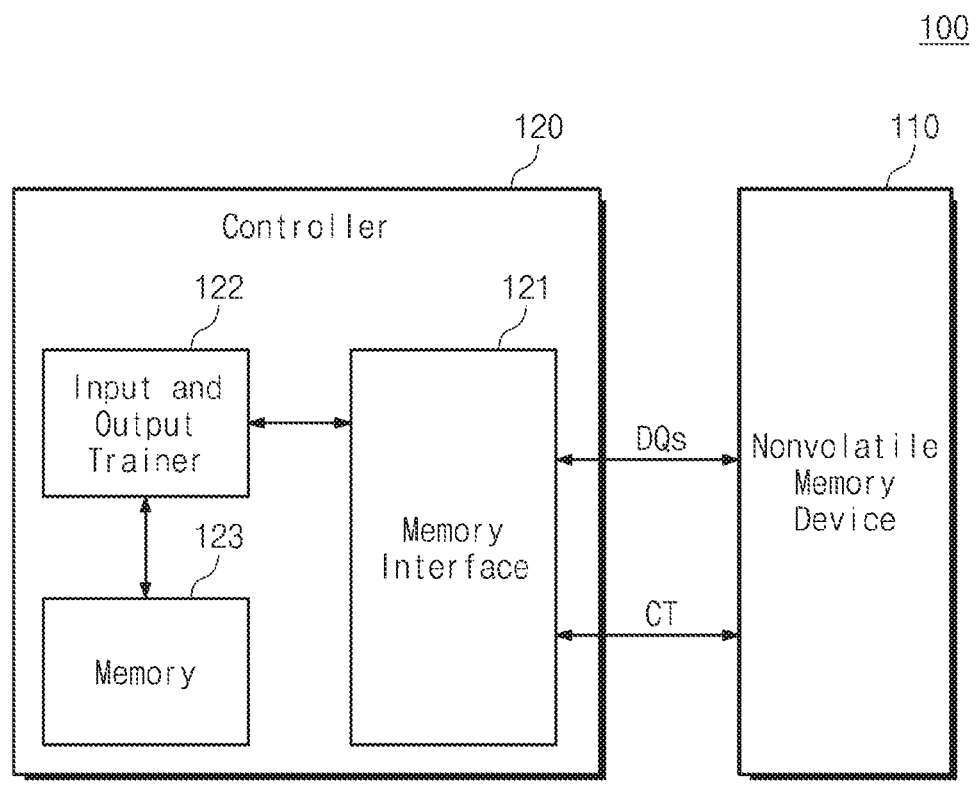
FIG. 1 is a block diagram illustrating a storage device according to an exemplary embodiment of the inventive concept.

Exemplary embodiments of the inventive concept provide a storage device which reduces a time for a training operation, verifies whether data transmission timings are changed, and dynamically adjusts the data transmission timings to cope with a change in an environment thereof.

Below, exemplary embodiments of the inventive concept will be described in detail with reference to the accompanying drawings Like reference numerals may refer to like elements throughout this application.

FIG. 1 is a block diagram illustrating a storage device according to an exemplary embodiment of the inventive concept. Referring to FIG. 1, a storage device 100 includes a nonvolatile memory device 110 and a controller 120. The nonvolatile memory device 110 may include various memories such as a flash memory, a phase-change random access memory (PRAM), a magnetoresistive RAM (MRAM), a resistive RAM (RRAM), a ferroelectric RAM (FRAM), etc.

The nonvolatile memory device 110 may include homogeneous memories or heterogeneous memories. The nonvolatile memory device 110 may communicate with the controller 120 through data input and output lines DQs and control lines CT.

The controller 120 is configured to control the nonvolatile memory device 110. The controller 120 may convey data to the nonvolatile memory device 110 through the data input and output lines DQs. The controller 120 may control the nonvolatile memory device 110 by transmitting and receiving control signals through the control lines CT. For example, the controller 120 may allow the nonvolatile memory device 110 to perform a write, read, or erase operation.

Additionally, the controller 120 may perform a training operation with the nonvolatile memory device 110. The training operation may include adjusting (e.g., aligning) timings when the controller 120 or the nonvolatile memory device 110 transmits data signals through the data input and output lines DQs. The accuracy and reliability of data signals received may be improved by adjusting timings to transmit the data signals.

The training operation may be performed after a power is supplied to the storage device 100 or after the storage device 100 switches from a power saving mode to a normal mode. The training operation may be performed before the controller 120 controls the nonvolatile memory device 110 normally (e.g., before the controller 120 allows the nonvolatile memory device 110 to perform a program, read, or erase operation).

The controller 120 includes a memory interface 121, an input and output trainer 122, and a memory 123. The memory interface 121 may communicate with the nonvolatile memory device 110. For example, the memory interface 121 may exchange signals having levels and timings determined by a given rule (e.g., the data signals and control signals) with the nonvolatile memory device 110.

The input and output trainer 122 may perform the training operation with the nonvolatile memory device 110 through the memory interface 121. The input and output trainer 122 may store pieces of information for the training operation or pieces of information (e.g., delays) obtained by the training operation. The input and output trainer 122 may perform the training operation with the nonvolatile memory device 110 by using the memory 123.

Figure 2:
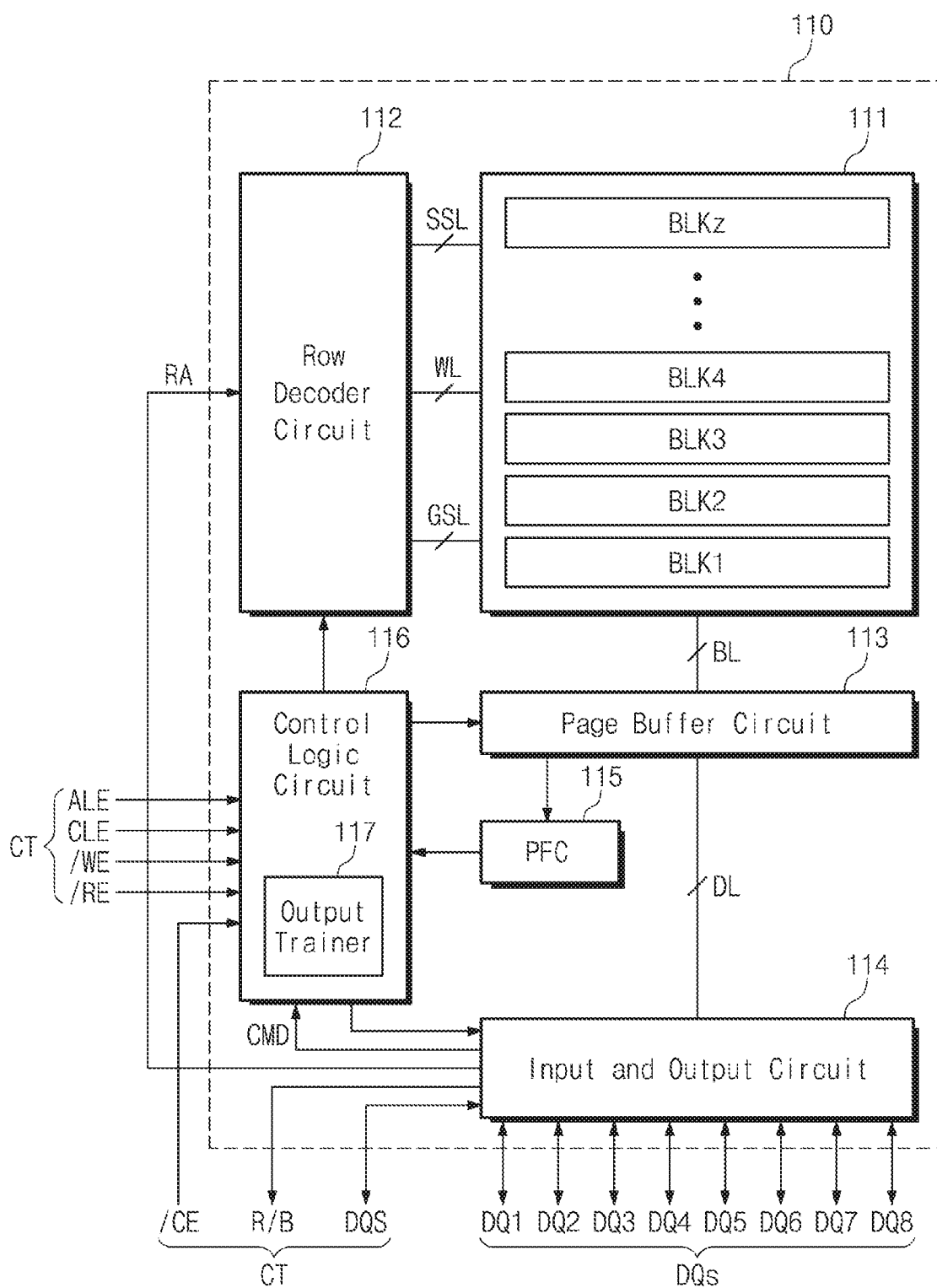
FIG. 2 is a block diagram illustrating a nonvolatile memory device of FIG. 1 according to an exemplary embodiment of the inventive concept.

FIG. 2 is a block diagram illustrating a nonvolatile memory device of FIG. 1 according to an exemplary embodiment of the inventive concept. Referring to FIGS. 1 and 2, the nonvolatile memory device 110 includes a memory cell array 111, a row decoder circuit 112, a page buffer circuit 113, an input and output circuit 114, a pass-fail check circuit 115, and a control logic circuit 116.

The memory cell array 111 includes a plurality of memory blocks BLK1 to BLKz. Each of the memory blocks BLK1 to BLKz may include a plurality of memory cells. Each of the memory blocks BLK1 to BLKz may be connected to the row decoder circuit 112 through at least one ground selection line GSL, a plurality of word lines WL, and at least one string selection line SSL. Each of the memory blocks BLK1 to BLKz may be connected to the page buffer circuit 113 through a plurality of bit lines BL. The plurality of memory blocks BLK1 to BLKz may be connected in common to the plurality of bit lines BL.

In an exemplary embodiment of the inventive concept, each of the memory blocks BLK1 to BLKz may correspond to a unit of an erase operation. The memory cells of the memory cell array 111 may be erased for each memory block. The memory cells belonging to one memory block may be erased at substantially the same time. As another example, each memory block may be divided into a plurality of sub-blocks. Each of the plurality of sub-blocks may be a unit of the erase operation.

The row decoder circuit 112 is connected to the memory cell array 111 through a plurality of ground selection lines GSL, the plurality of word lines WL, and a plurality of string selection lines SSL. The row decoder circuit 112 operates under control of the control logic circuit 116. The row decoder circuit 112 may receive a row address RA from the input and output circuit 114. The row decoder circuit 112 may decode the received row address RA and may control voltages to be applied to the string selection lines SSL, the word lines WL, and the ground selection lines GSL based on the decoded row address RA.

The page buffer circuit 113 is connected to the memory cell array 111 through the plurality of bit lines BL. The page buffer circuit 113 is connected with the input and output circuit 114 through a plurality of data lines DL. The page buffer circuit 113 operates under control of the control logic circuit 116.

In a write operation, the page buffer circuit 113 may store data bits to be programmed to memory cells. The page buffer circuit 113 may apply voltages to the plurality of bit lines BL, based on the stored data bits. For example, the page buffer circuit 113 may function as a write driver. In a read operation or a verification read operation, the page buffer circuit 113 may sense voltages of the bit lines BL and may store the sensed result. For example, the page buffer circuit 113 may function as a sense amplifier.

The input and output circuit 114 is connected with the page buffer circuit 113 through the plurality of data lines DL. The input and output circuit 114 may be connected with the controller 120 through first to eighth data input and output lines DQ1 to DQ8. For example, the first to eighth data input and output lines DQ1 to DQ8 may be included in the data input and output lines DQ described with reference to FIG. 1.

The input and output circuit 114 may output data bits read by the page buffer circuit 113 to the controller 120 as data signals through the first to eighth data input and output lines DQ1 to DQ8. Additionally, the input and output circuit 114 may transmit data signals received from the controller 120 through the first to eighth data input and output lines DQ1 to DQ8 to the page buffer circuit 113 as data bits.

The input and output circuit 114 may receive addresses through the first to eighth data input and output lines DQ1 to DQ8. The input and output circuit 114 may transmit the row address RA of the received addresses to the row decoder circuit 112. By using a column address of the received addresses, the input and output circuit 114 may store data bits to the page buffer circuit 113 or may read data bits stored in the page buffer circuit 113.

The input and output circuit 114 may receive a command CMD through the first to eighth data input and output lines DQ1 to DQ8. The input and output circuit 114 may transmit the received command CMD to the control logic circuit 116. The input and output circuit 114 may receive a data strobe signal DQS from the controller 120. The input and output circuit 114 may latch data signals received through the first to eighth data input and output lines DQ1 to DQ8 as data bits in synchronization with the data strobe signal DQS.

The input and output circuit 114 may output the data strobe signal DQS to the controller 120. The input and output circuit 114 may output the data strobe signal DQS in synchronization with a timing to transmit data bits as data signals through the first to eighth data input and output lines DQ1 to DQ8. The data strobe signal DQS may be received and output through a part of the control lines CT.

For example, when data signals are transmitted from the controller 120 to the nonvolatile memory device 110, the data strobe signal DQS may be controlled by the controller 120. When data signals are transmitted from the nonvolatile memory device 110 to the controller 120, the data strobe signal DQS may be controlled by the nonvolatile memory device 110.

The input and output circuit 114 may output a ready/busy signal R/B to the controller 120. For example, when the input and output circuit 114 receives a command, an address, or data bits from the controller 120, the input and output circuit 114 may output the ready/busy signal R/B indicating a ready state. When the input and output circuit 114 cannot receive a command, an address, or data bits from the controller 120, the input and output circuit 114 may output the ready/busy signal R/B indicating a busy state. The ready/busy signal R/B may be output through a part of the control lines CT.

After the verification read operation, the pass-fail check circuit (PFC) 115 may receive a sensing result from the page buffer circuit 113. The pass-fail check circuit 115 may determine a write (or erase) pass or fail, based on the received sensing result. A result of determining a pass or a fail is provided to the control logic circuit 116.

The control logic circuit 116 may receive an address latch enable signal ALE, a command latch enable signal CLE, a write enable signal /WE, a read enable signal /RE, and a chip enable signal /CE from the controller 120. The address latch enable signal ALE, the command latch enable signal CLE, the write enable signal /WE, the read enable signal /RE, and the chip enable signal /CE may be received through a part of the control lines CT.

The address latch enable signal ALE indicates that data signals input through the first to eighth data input and output lines DQ1 to DQ8 correspond to an address. If the address latch enable signal ALE is activated, the control logic circuit 116 may process the data signals received through the first to eighth data input and output lines DQ1 to DQ8 as an address. For example, the control logic circuit 116 may control the nonvolatile memory device 110 such that the row address RA is transmitted to the row decoder circuit 112.

The command latch enable signal CLE indicates that data signals input through the first to eighth data input and output lines DQ1 to DQ8 correspond to the command CMD. If the command latch enable signal CLE is activated, the control logic circuit 116 may process the data signals received through the first to eighth data input and output lines DQ1 to DQ8 as the command CMD. For example, the control logic circuit 116 may fetch the command CMD stored in the input and output circuit 114 and may execute the fetched command CMD.

When the command CMD or an address is received through the first to eighth data input and output lines DQ1 to DQ8, the write enable signal /WE may indicate a timing to store (or latch) data bits of the first to eighth data input and output lines DQ1 to DQ8. The read enable signal /RE may be used for the controller 120 to provide any clock to the nonvolatile memory device 110 in a read (or output) operation.

For example, in the read operation, the controller 120 may allow the read enable signal /RE to toggle to a high level and a low level periodically. The control logic circuit 116 may transmit the read enable signal /RE to the input and output circuit 114. The input and output circuit 114 may delay the read enable signal /RE to generate the data strobe signal DQS. The input and output circuit 114 may transmit data signals through the first to eighth data input and output lines DQ1 to DQ8 in synchronization with the data strobe signal DQS thus generated.

The chip enable signal /CE may activate the nonvolatile memory device 110. When the controller 120 activates the chip enable signal /CE, the nonvolatile memory device 110 may receive data signals transmitted through the first to eighth data input and output lines DQ1 to DQ8. When the controller 120 deactivates the chip enable signal /CE, the nonvolatile memory device 110 may ignore data signals transmitted through the first to eighth data input and output lines DQ1 to DQ8.

The control logic circuit 116 may include an output trainer 117. The output trainer 117 may perform a training operation on data signals which the input and output circuit 114 outputs through the first to eighth data input and output lines DQ1 to DQ8 in the read operation. The training operation will be more fully described later with reference to accompanying drawings.

Figure 3:
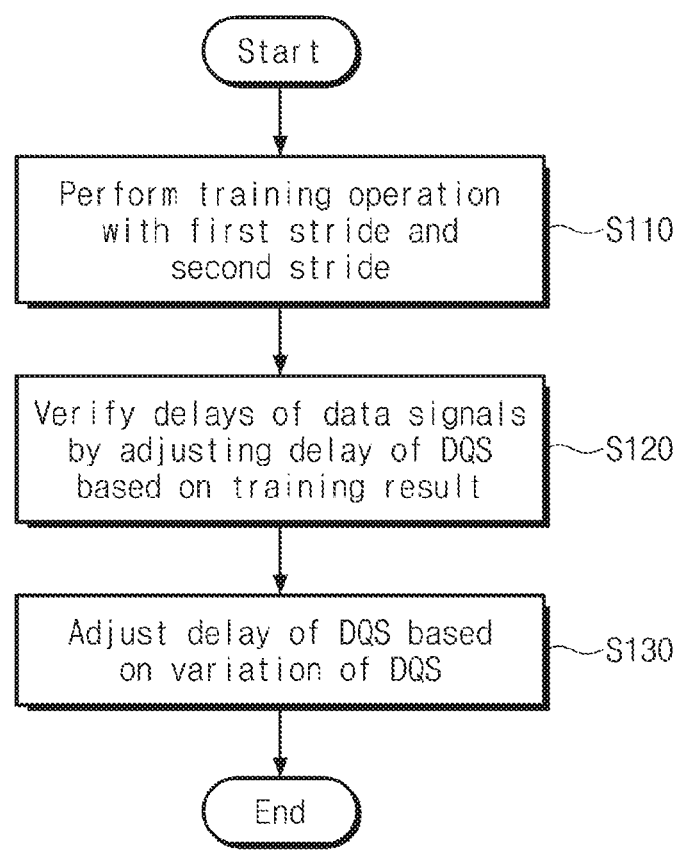
FIG. 3 is a flowchart illustrating an operating method of the storage device of FIG. 1 according to an exemplary embodiment of the inventive concept.

FIG. 3 is a flowchart illustrating an operating method of the storage device of FIG. 1 according to an exemplary embodiment of the inventive concept. Referring to FIGS. 1 to 3, in operation S110, the storage device 100 may perform a training operation with a first stride and a second stride. The nonvolatile memory device 110 or the controller 120 may perform the training operation while adjusting delays upon transmitting data signals with the first stride and the second stride. A time taken to perform the training operation may decrease by performing the training operation with two or more strides.

In operation S120, the storage device 100 may adjust a delay of the data strobe signal DQS based on a result of the training operation and may verify delays of data signals transmitted through the first to eighth data input and output lines DQ1 to DQ8. For example, the nonvolatile memory device 110 or the controller 120 may verify whether delays of data signals aligned by the training operation are distorted or biased. The reliability of the storage device 100 may be improved by verifying the delays of the data signals.

In operation S130, the storage device 100 may adjust a delay of the data strobe signal DQS based on a variation of the data strobe signal DQS. For example, the nonvolatile memory device 110 or the controller 120 may adjust the delay of the data strobe signal DQS based on a variation in a length of one period of the data strobe signal DQS. Accordingly, the distortion or biasing of timings to transmit data signals due to the variation of the data strobe signal DQS may be compensated.

Figure 4:
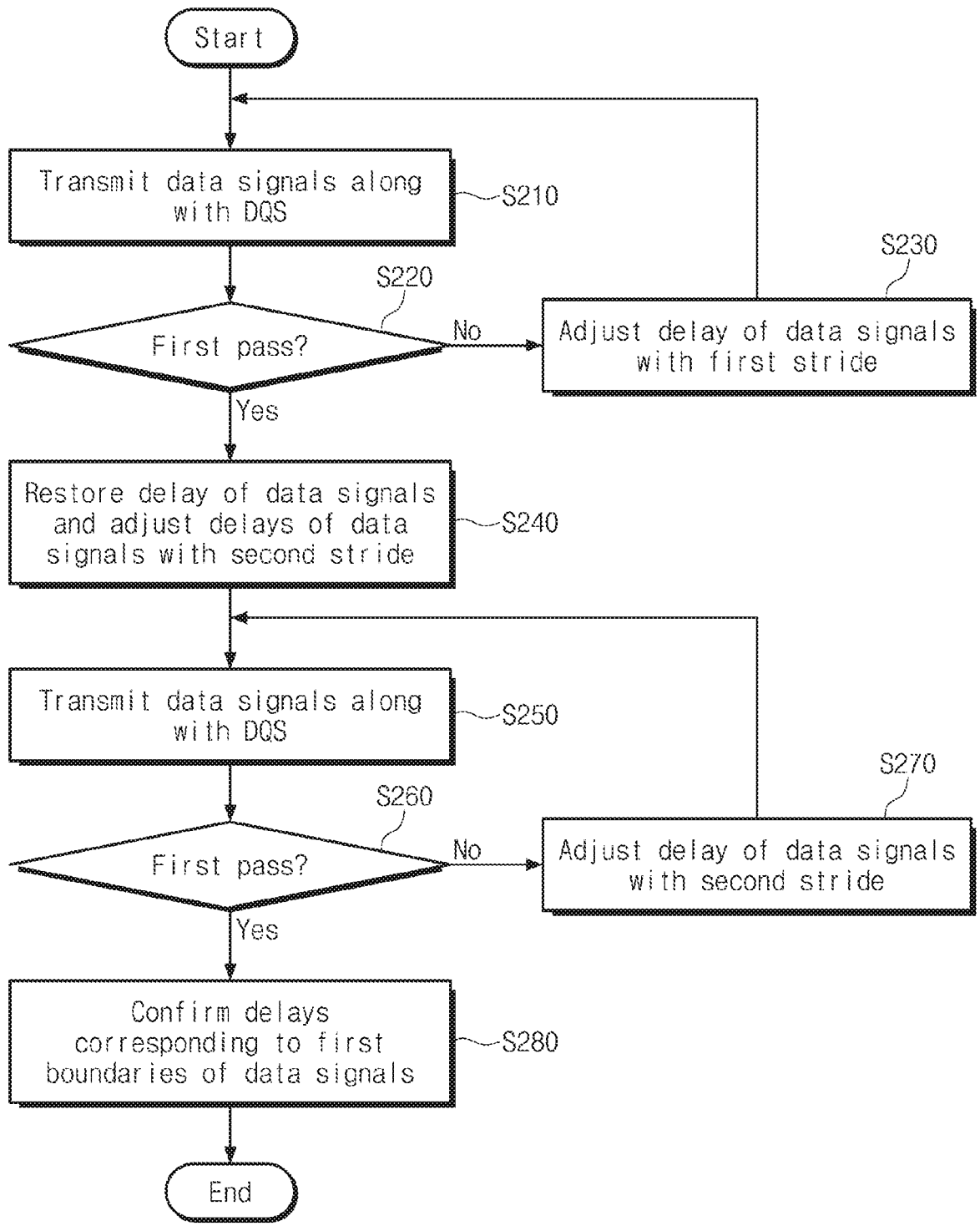
FIG. 4 is a flowchart illustrating an example in which the storage device of FIG. 1 performs a training operation with a first stride and a second stride according to an exemplary embodiment of the inventive concept.

FIG. 4 is a flowchart illustrating an example in which the storage device of FIG. 1 performs a training operation with a first stride and a second stride (operation S110 of FIG. 3) according to an exemplary embodiment of the inventive concept. Referring to FIGS. 1, 2, and 4, in operation S210, the nonvolatile memory device 110 or the controller 120 may transmit data signals together with the data strobe signal DQS.

For example, a training operation may include a read training and a write training. The read training may be performed to align timings at which the nonvolatile memory device 110 transmits the data strobe signal DQS and data signals. The write training may be performed to align timings at which the controller 120 transmits the data strobe signal DQS and data signals.

In the read training, under control of the controller 120, the output trainer 117 of the nonvolatile memory device 110 may output particular data bits to the controller 120 as data signals through the first to eighth data input and output lines DQ1 to DQ8. The nonvolatile memory device 110 may transmit the data strobe signal DQS together with the data signals.

In the write training, the input and output trainer 122 of the controller 120 may output particular data bits to the nonvolatile memory device 110 as data signals through the first to eighth data input and output lines DQ1 to DQ8. The controller 120 may output the data strobe signal DQS to the nonvolatile memory device 110 together with the data signals. The nonvolatile memory device 110 may latch the data signals in synchronization with the data strobe signal DQS and may store the latched data signals.

In operation S220, the controller 120 may determine whether a first pass occurs. For example, in the read training, the controller 120 may latch data signals in synchronization with the data strobe signal DQS received from the nonvolatile memory device 110 as data bits.

When the latched data bits are matched with particular data bits, e.g., when the particular data bits are accurately identified, the input and output trainer 122 of the controller 120 may determine a pass. When at least one of the latched data bits is not matched with a corresponding one of the particular data bits, e.g., when at least one of the particular data bits is not accurately identified, the input and output trainer 122 of the controller 120 may determine a fail.

In the write training, the controller 120 may request data bits from the nonvolatile memory device 110. The nonvolatile memory device 110 may transmit stored data bits to the controller 120 through the first to eighth data input and output lines DQ1 to DQ8 as second data signals. The nonvolatile memory device 110 may transmit the data strobe signal DQS to the controller 120 together with the second data signals.

The controller 120 may latch the second data signals in synchronization with the data strobe signal DQS and may store the latched second data signals as second data bits. When the second data bits are matched with particular data bits, the input and output trainer 122 of the controller 120 may determine a pass. When at least one of the second data bits is not matched with a corresponding one of the particular data bits, the input and output trainer 122 of the controller 120 may determine a fail.

When a pass is not determined in operation S220, operation S230 is performed. In operation S230, the storage device 100 may adjust delays of data signals with the first stride. For example, in the read training, the output trainer 117 of the nonvolatile memory device 110 may increase delays of data signals to be transmitted with the first stride. In the write training, the input and output trainer 122 of the controller 120 may increase delays of data signals to be transmitted with the first stride. Afterwards, operation S210 is again performed.

When the pass is determined in operation S220 for the first time, operation S240 is performed. In operation S240, the storage device 100 may restore delays of data signals and may adjust the delays of the data signals with the second stride. For example, the output trainer 117 (in the read training) or the input and output trainer 122 (in the write training) may restore delays of the data signals by reducing delays of the data signals as much as the first stride.

Afterwards, the output trainer 117 or the input and output trainer 122 may increase the delays of the data signals as much as the second stride. For example, the second stride may be smaller than the first stride.

In operation S250, the storage device 100 may transmit the data signals together with the data strobe signal DQS. The output trainer 117 (in the read training) or the input and output trainer 122 (in the write training) may transmit the data signals with the delays adjusted as much as the second stride.

As in operation S220, in operation S260, the input and output trainer 122 of the controller 120 may determine whether a pass is detected for the first time after delays start to be adjusted with the second stride.

When the fail is determined at operation S260, operation S270 is performed. As in operation S230, in operation S270, the storage device 100 may increase delays of data signals as much as the second stride. Afterwards, operation S250 is again performed.

When the pass is determined in operation S260 for the first time, operation S280 is performed. In operation S280, the input and output trainer 122 of the controller 120 may confirm delays corresponding to first boundaries of the data signals.

Figure 5:
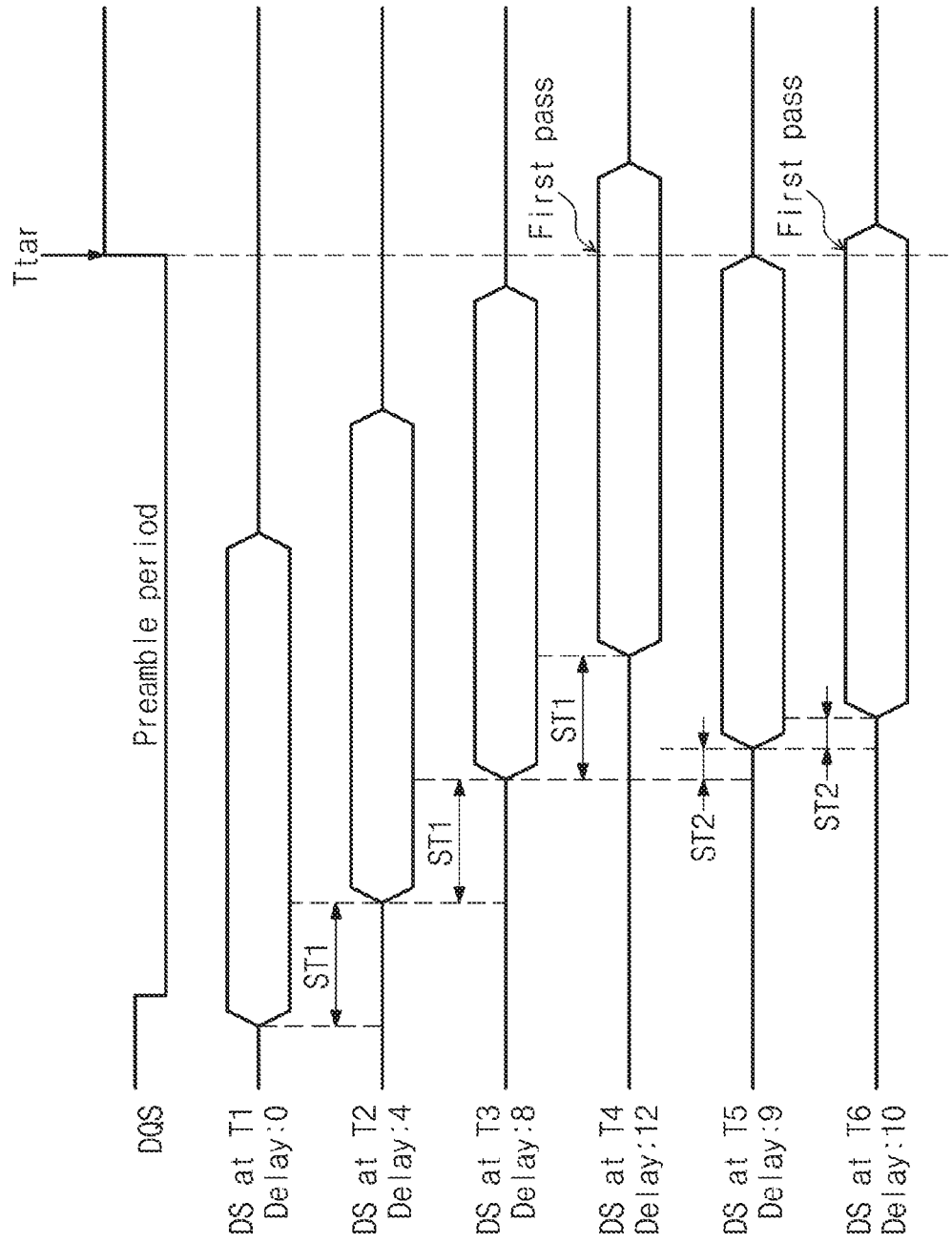
FIG. 5 illustrates an example of determining a delay corresponding to a first boundary of a particular data signal according to an exemplary embodiment of the inventive concept.

FIG. 5 illustrates an example of determining a delay corresponding to a first boundary of a particular data signal (operation S260 of FIG. 4) according to an exemplary embodiment of the inventive concept. Referring to FIGS. 1, 2, and 5, the controller 120 or the nonvolatile memory device 110 may fix a delay of the data strobe signal DQS, and may repeatedly transmit the data strobe signal DQS and a data signal DS while adjusting a delay of the data signal DS.

The data strobe signal DQS may start transitions to a high level and a low level after a preamble period passes. In the read training, the controller 120 may identify the data signal DS in synchronization with a target timing Ttar of the data strobe signal DQS. In other words, when a valid period (e.g., a period expressed by a hexagon) overlaps the target timing Ttar, the controller 120 may identify the data signal DS accurately (or correctly).

In the write training, the nonvolatile memory device 110 may identify the data signal DS in synchronization with the target timing Ttar of the data strobe signal DQS. In other words, when a valid period (e.g., a period expressed by a hexagon) overlaps the target timing Ttar, the nonvolatile memory device 110 may identify the data signal DS accurately (or correctly), and may return an accurate (or correct) second data signal to the controller 120.

At a first timing T1, the controller 120 or the nonvolatile memory device 110 may adjust a delay to "0" to transmit the data signal DS or may transmit the data signal DS with an initial delay of "0". Since a valid period of the data signal DS does not overlap the target timing Ttar, the controller 120 may determine a fail.

The controller 120 or the nonvolatile memory device 110 may increase the delay of the data signal DS as much as a first stride ST1. For example, a delay of the first stride ST1 may be "4". At a second timing T2, the controller 120 or the nonvolatile memory device 110 may transmit the data signal DS with the delay of "4". Since the valid period of the data signal DS does not overlap the target timing Ttar, the controller 120 may determine a fail.

The controller 120 or the nonvolatile memory device 110 may increase the delay of the data signal DS as much as the first stride ST1. At a third timing T3, the controller 120 or the nonvolatile memory device 110 may transmit the data signal DS with a delay of "8". Since the valid period of the data signal DS does not overlap the target timing Ttar, the controller 120 may determine a fail.

The controller 120 or the nonvolatile memory device 110 may increase the delay of the data signal DS as much as the first stride ST1. At a fourth timing T4, the controller 120 or the nonvolatile memory device 110 may transmit the data signal DS with a delay of "12". Since the valid period of the data signal DS overlaps the target timing Ttar, the controller 120 may determine a pass.

A training for finding a first pass with the first stride may be a coarse training. After finding a location of the first pass through the coarse training, a fine training for finding a first pass with the second stride may be performed.

The controller 120 or the nonvolatile memory device 110 may restore a delay of the data signal DS to an immediately previous delay, e.g., "8". Additionally, the controller 120 or the nonvolatile memory device 110 may increase the delay of the data signal DS as much as a second stride ST2. For example, a delay of the second stride ST2 may be "1". At a fifth timing T5, the controller 120 or the nonvolatile memory device 110 may transmit the data signal DS with a delay of "9". Since the valid period of the data signal DS does not overlap the target timing Ttar, the controller 120 may determine a fail.

The controller 120 or the nonvolatile memory device 110 may increase the delay of the data signal DS as much as the second stride ST2. At a sixth timing T6, the controller 120 or the nonvolatile memory device 110 may transmit the data signal DS with a delay of "10". Since the valid period of the data signal DS overlaps the target timing Ttar, the controller 120 may determine a pass.

The controller 120 may confirm that the delay of "9" or "10" corresponds to a first boundary (e.g., a right boundary) of the data signal DS. As such, a process of finding the first boundary may be performed on each of data signals of the first to eighth data input and output lines DQ1 to DQ8. The controller 120 may confirm delays of the data signals, which correspond to first boundaries (e.g., right boundaries), respectively.

As in the description given with reference to FIGS. 4 and 5, second boundaries (e.g., left boundaries) of the data signals may be confirmed. As described with reference to FIGS. 4 and 5, after the first boundaries are confirmed, the controller 120 or the nonvolatile memory device 110 may find the second boundaries of the data signals while further increasing delays of the data signals.

For example, in the case where a first pass determined in operation S220 and operation S260 of FIG. 4 is replaced with a first fail, the method of FIG. 4 may be applied to a training for finding the second boundaries of the data signals. As described with reference to FIG. 5, the nonvolatile memory device 110 or the controller 120 may transmit the data signal DS and the data strobe signal DQS while increasing a delay with the first stride ST1.

When the valid period of the data signal DS passes the target timing Ttar, the controller 120 may determine a fail. The nonvolatile memory device 110 or the controller 120 may restore a delay of the data signal DS to an immediately previous delay and may find a first fail while increasing the delay as much as the second stride ST2. A delay when the first fail is identified in the fine training may be confirmed as a delay corresponding to the second boundary of the data signal DS.

The controller 120 may calculate delays corresponding to the center of data signals from the delays corresponding to the first boundaries of the data signals and the delays corresponding to the second boundaries of the data signals. The input and output trainer 122 of the controller 120 may set delays of data signals of the input and output circuit 114 of the nonvolatile memory device 110 to corresponding delays to the center calculated in the read training.

The input and output trainer 122 of the controller 120 may set delays of data signals of the memory interface 121 to delays corresponding to the center calculated in the write training. In the case where the delays are set, the centers of the data signals may be aligned at the target timing Ttar of the data strobe signal DQS.

A description is given in FIG. 5 as delays of data signals are adjusted by using the first stride ST1 and the second stride ST2. However, the delays of the data signals may be adjusted by using three or more strides.

Figure 6:
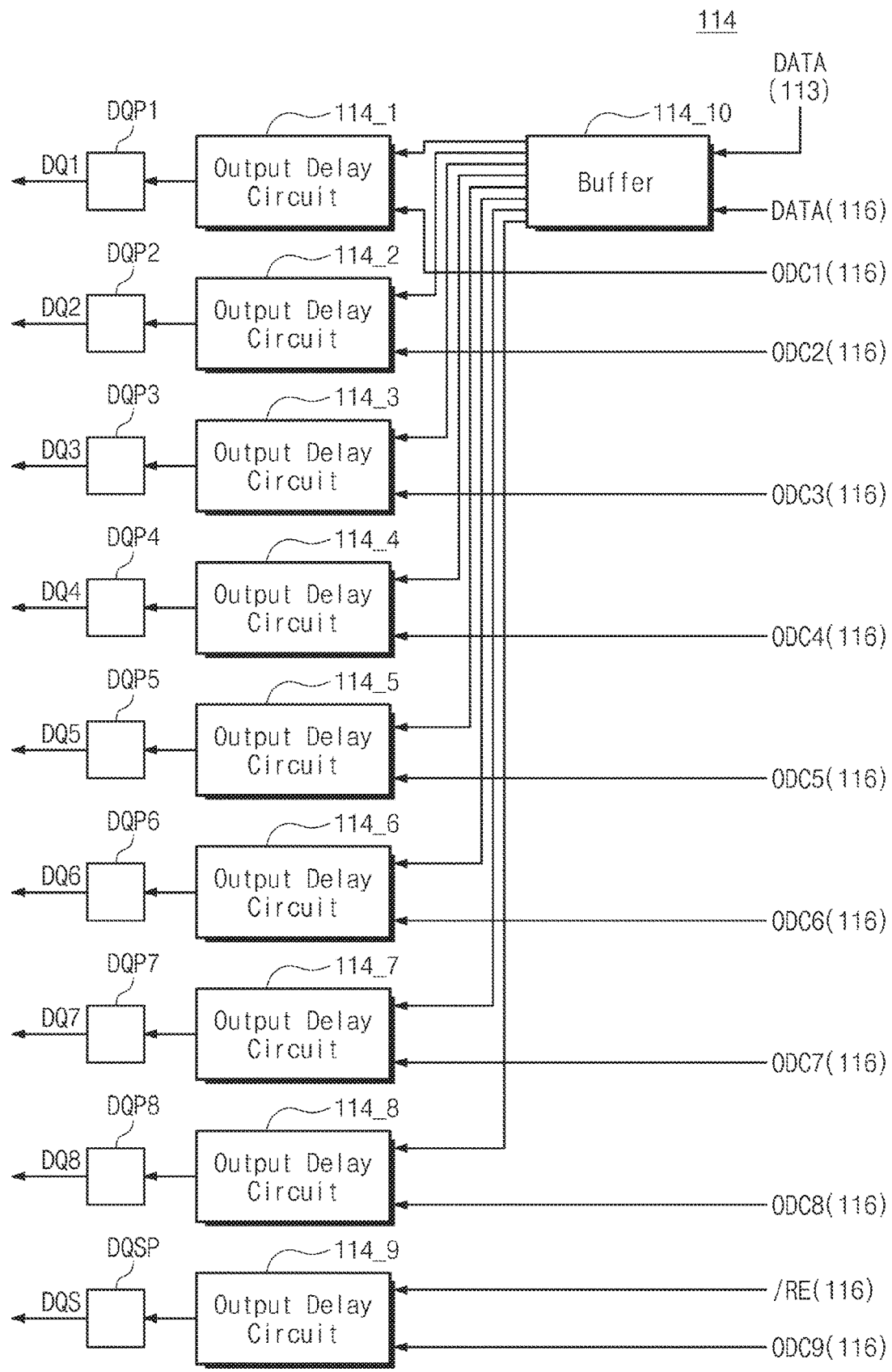
FIG. 6 illustrates an input and output circuit of the nonvolatile memory device of FIG. 2 according to an exemplary embodiment of the inventive concept.

FIG. 6 illustrates an input and output circuit of the nonvolatile memory device of FIG. 2 according to an exemplary embodiment of the inventive concept. In an exemplary embodiment of the inventive concept, components, which output a signal to the controller 120, from among components of the input and output circuit 114 are illustrated in FIG. 6. Referring to FIGS. 2 and 6, the input and output circuit 114 includes first to eighth data input and output pads DQP1 to DQP8, a data strobe pad DQSP, first to ninth output delay circuits 114_1 to 114_9, and a buffer 114_10.

The first to eighth data input and output pads DQP1 to DQP8 may be connected to the first to eighth data input and output lines DQ1 to DQ8. The data strobe pad DQSP may be connected to a control line transmitting the data strobe signal DQS.

The first to eighth output delay circuits 114_1 to 114_8 are respectively connected to the first to eighth data input and output pads DQP1 to DQP8. The first to eighth output delay circuits 114_1 to 114_8 may transmit data bits from the buffer 114_10 to the first to eighth data input and output pads DQP1 to DQP8 as data signals, respectively. The first to eighth output delay circuits 114_1 to 114_8 may receive first to eighth output delay control signals ODC1 to ODC8 from the control logic circuit 116, respectively.

The first to eighth output delay circuits 114_1 to 114_8 may individually control timings to output data signals (or delays of the data signals) in response to the first to eighth output delay control signals ODC1 to ODC8. For example, the first output delay circuit 114_1 may adjust a timing to transmit a data bit from the buffer 114_10 as a data signal (e.g., may adjust a delay of the data signal) in response to the first output delay control signal ODC1.

In the read training, the first to eighth output delay circuits 114_1 to 114_8 may individually control delays of data signals with the first stride ST1 or the second stride ST2 in response to the first to eighth output delay control signals ODC1 to ODC8. After the read training is completed, the first to eighth output delay circuits 114_1 to 114_8 may confirm the delays of the data signals in response to the first to eighth output delay control signals ODC1 to ODC8.

The ninth output delay circuit 114_9 may delay the read enable signal /RE received from the control logic circuit 116 and may output the delayed read enable signal /RE to the data strobe pad DQSP as the data strobe signal DQS. The ninth output delay circuit 114_9 may adjust a delay of the data strobe signal DQS in response to a ninth output delay control signal ODC9.

The buffer 114_10 may transmit data bits to the first to eighth output delay circuits 114_1 to 114_8. For example, in the training operation, data bits DB transmitted from the control logic circuit 116 may be stored to the buffer 114_10 and may be provided to the output delay circuits 114_1 to 114_8. In a general operation in which a training operation is not performed, data "DATA" transmitted from the page buffer circuit 113 may be stored to the buffer 114_10 and may be provided to the output delay circuits 114_1 to 114_8.

Figure 7:
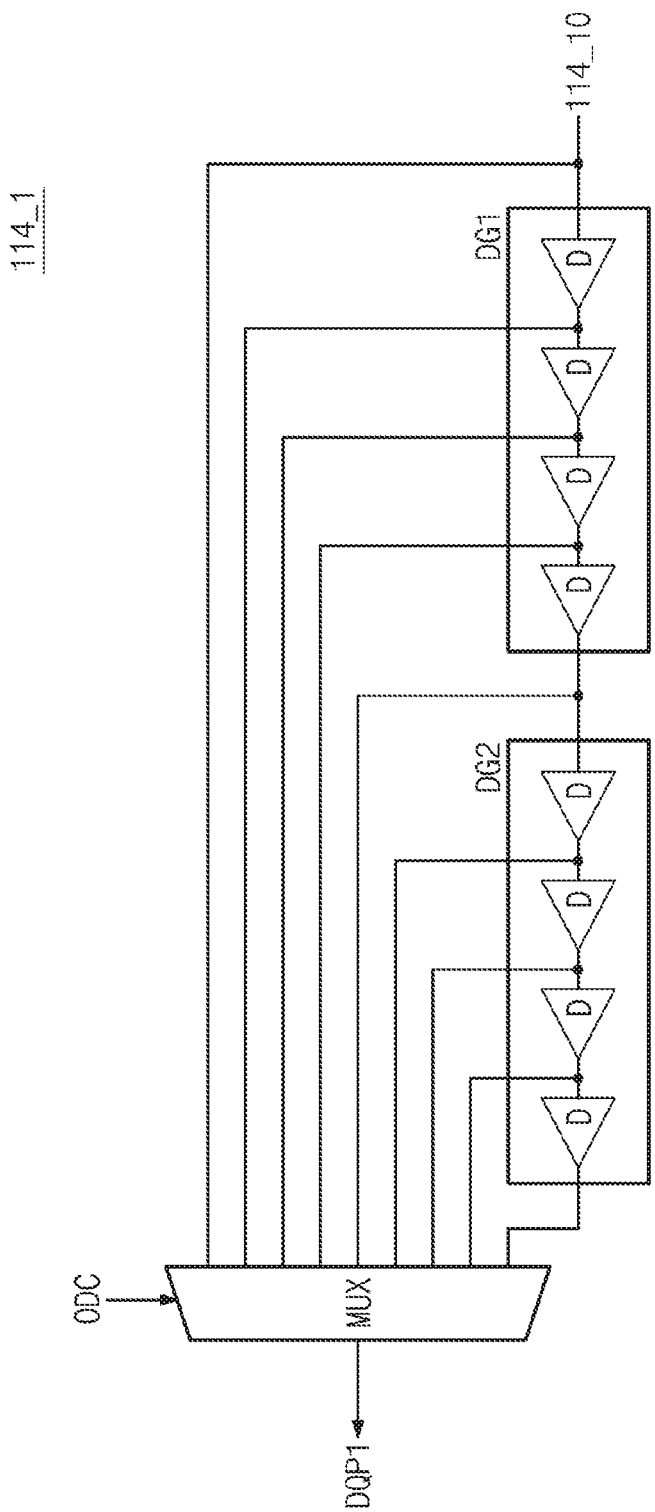
FIG. 7 illustrates an output delay circuit of FIG. 6 according to an exemplary embodiment of the inventive concept.

FIG. 7 illustrates an output delay circuit of FIG. 6 according to an exemplary embodiment of the inventive concept. Referring to FIGS. 1, 2, 6, and 7, the output delay circuit 114_1 may include a first delay group DG1, a second delay group DG2, and a multiplexer MUX. The first delay group DG1 and the second delay group DG2 may be connected sequentially. Data bits transmitted from the buffer 114_10 may be input to the first delay group DG1. An output of the first delay group DG1 may be transmitted to the second delay group DG2.

Each of the first delay group DG1 and the second delay group DG2 may include four delay units "D". Each of the first delay group DG1 and the second delay group DG2 may increase a delay of a data signal as much as the first stride ST1. The delay of the first stride ST1 may correspond to a delay of four delay units "D". In other words, the delay of the first stride ST1 may be "4". Each of the delay units "D" may increase a delay of the data signal as much as the second stride ST2. In other words, a delay of the second stride ST2 may be "1".

The multiplexer MUX may receive a data bit output from the buffer 114_10, data bits delayed by the first delay group DG1 and the second delay group DG2, and data bits (e.g., data bits having different delays) delayed by the delay units "D" in the first delay group DG1 and the second delay group DG2.

The multiplexer MUX may transmit one of the received data bits to the data input and output pad DQP1 as a data signal in response to the first output delay control signal ODC1. In other words, the control logic circuit 116 or the output trainer 117 may adjust a timing when the output delay circuit 114_1 outputs a data bit (e.g., may adjust a delay of the data bit) by adjusting a data bit selected by the output delay control signal ODC1.

Only the output delay circuit 114_1 is illustrated in FIG. 7, but the remaining output delay circuits 114_2 to 114_8 may also have substantially the same structure as illustrated in FIG. 7. The output trainer 117 of the control logic circuit 116 may individually control timings when the first to eighth output delay circuits 114_1 to 114_8 transmit data signals (e.g., delays of the data signals) and a timing when the ninth output delay circuit 114_9 transmits the data strobe signal DQS, by individually adjusting the first to ninth output delay control signals ODC1 to ODC9.

Two delay groups are illustrated in FIG. 7, but the number of delay groups included in the output delay circuit 114_1 is not limited thereto. Additionally, an example is illustrated in FIG. 7 where one delay group includes four delay units, but the number of delay units included in one delay group is not limited thereto.

Figure 8:
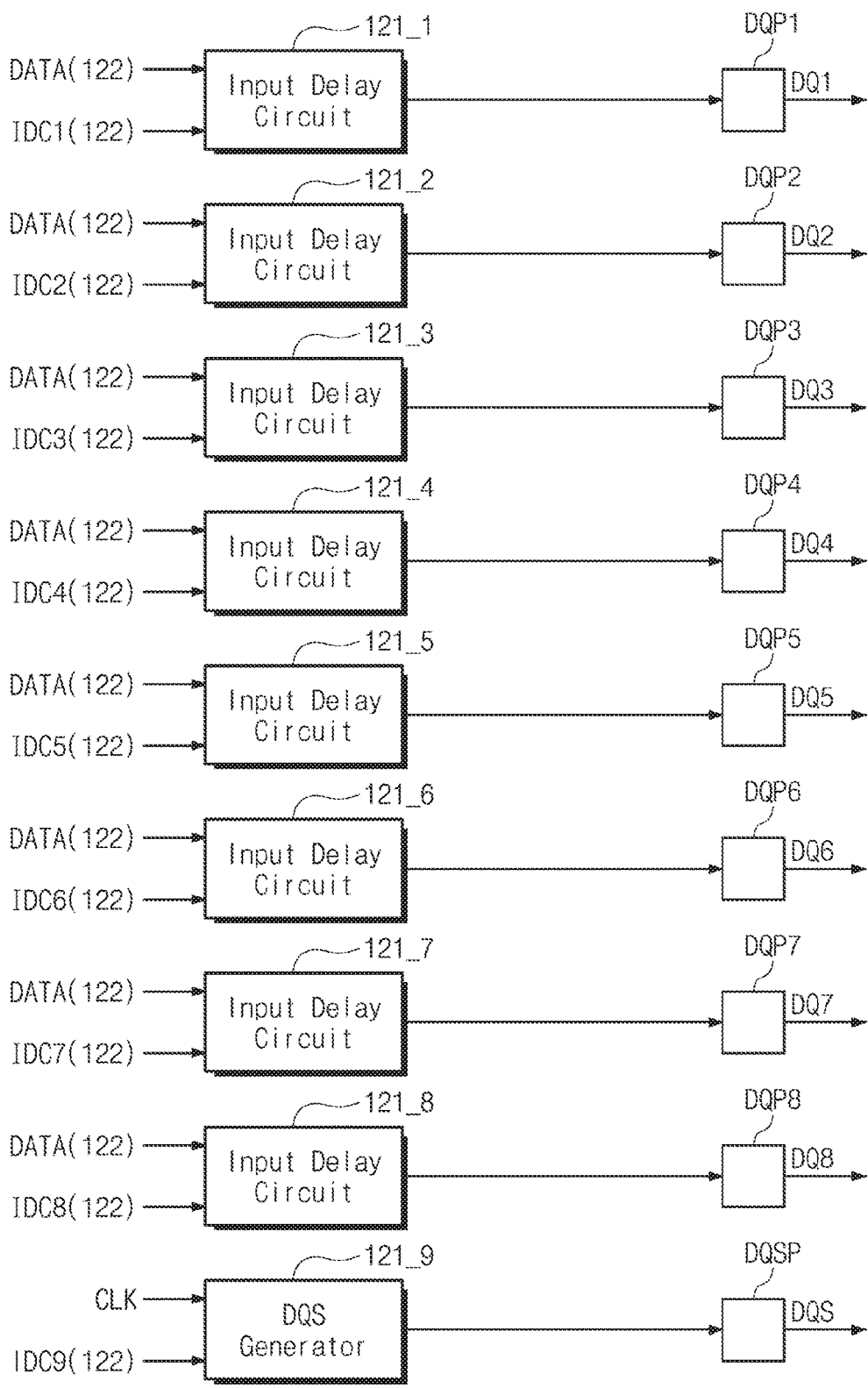
FIG. 8 illustrates a memory interface of a controller of FIG. 1 according to an exemplary embodiment of the inventive concept.

FIG. 8 illustrates a memory interface of a controller of FIG. 1 according to an exemplary embodiment of the inventive concept. In an exemplary embodiment of the inventive concept, components, which are associated with the case where the controller 120 transmits a signal to the nonvolatile memory device 110, from among components of the memory interface 121, are illustrated in FIG. 8. Referring to FIGS. 1 and 8, the memory interface 121 includes the first to eighth data input and output pads DQP1 to DQP8, the data strobe pad DQSP, first to eighth input delay circuits 121_1 to 121_8, and a data strobe signal (DQS) generator 121_9.

The first to eighth data input and output pads DQP1 to DQP8 are connected to the first to eighth data input and output lines DQ1 to DQ8. The data strobe pad DQSP is connected to a control line transmitting the data strobe signal DQS.

The first to eighth input delay circuits 121_1 to 121_8 are respectively connected to the first to eighth data input and output pads DQP1 to DQP8. In a training operation, the first to eighth input delay circuits 121_1 to 121_8 may transmit data bits from the memory 123 through the input and output trainer 122 to the first to eighth data input and output pads DQP1 to DQP8, respectively, as data signals. In a general operation, not the training operation, the first to eighth input delay circuits 121_1 to 121_8 may transmit data bits requested by the controller 120 to the first to eighth data input and output pads DQP1 to DQP8, respectively, as data signals.

In the training operation, the first to eighth input delay circuits 121_1 to 121_8 may receive first to eighth input delay control signals IDC1 to IDC8, respectively, from the input and output trainer 122.

The first to eighth input delay circuits 121_1 to 121_8 may individually control timings to transmit data signals (e.g., delays of the data signals) in response to the input delay control signals IDC1 to IDC8. For example, the first input delay circuit 121_1 may adjust a timing to transmit a data signal from the input and output trainer 122 (e.g., a delay of the data signal) in response to the first input delay control signal IDC1. In an exemplary embodiment of the inventive concept, the first to eighth input delay circuits 121_1 to 121_8 may have substantially the same structure as illustrated in FIG. 7.

In the write training, the first to eighth input delay circuits 121_1 to 121_8 may individually control delays of data signals with the first stride ST1 or the second stride ST2 in response to the first to eighth input delay control signals IDC1 to IDC8. After the write training is completed, the first to eighth input delay circuits 121_1 to 121_8 may confirm the delays of the data signals in response to the first to eighth input delay control signals IDC1 to IDC8.

The data strobe signal generator 121_9 may receive a clock CLK. The clock CLK may be generated within the controller 120 or may be supplied from an external device to the controller 120. The data strobe signal generator 121_9 may generate the data strobe signal DQS by using the clock CLK.

The data strobe signal generator 121_9 may receive the ninth input delay control signal IDC9 from the input and output trainer 122. In response to the ninth input delay control signal IDC9, the data strobe signal generator 121_9 may adjust a timing to transmit the data strobe signal DQS (e.g., may adjust a delay of the data strobe signal DQS). In an exemplary embodiment of the inventive concept, the data strobe signal generator 121_9 may have substantially the same structure as illustrated in FIG. 7.

Figure 9:
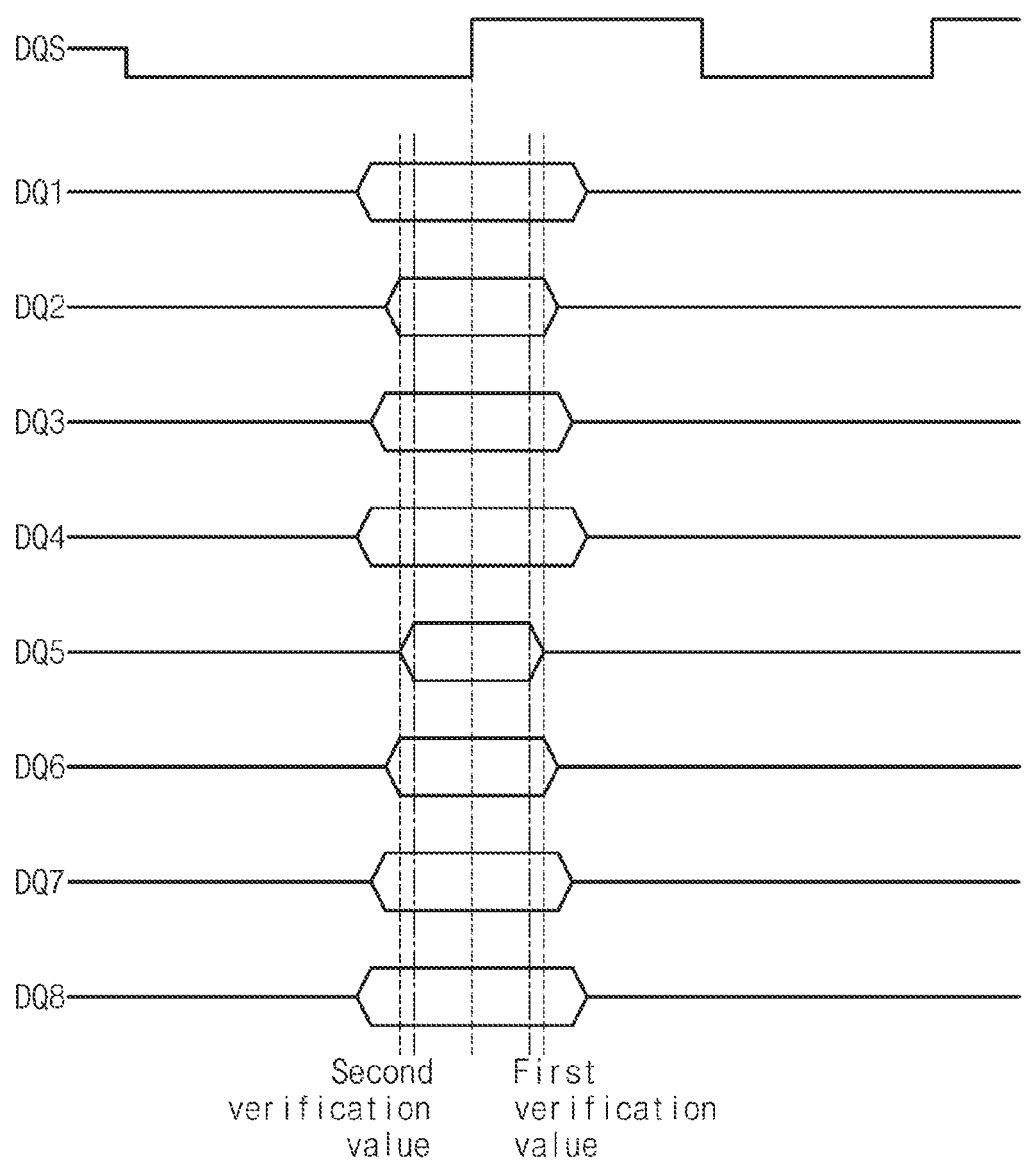
FIG. 9 illustrates an example in which delays of data signals of first to eighth data input and output lines are aligned with a data strobe signal according to an exemplary embodiment of the inventive concept.

FIG. 9 illustrates an example in which delays of data signals of first to eighth data input and output lines are aligned with a data strobe signal according to an exemplary embodiment of the inventive concept. When data signals are aligned with the data strobe signal DQS, the nonvolatile memory device 110 or the controller 120 may transmit the data strobe signal DQS and the data signals as illustrated in FIG. 9. The centers of data signals may be synchronized with an edge at which the data strobe signal DQS toggles.

In an exemplary embodiment of the inventive concept, valid periods of the data signals may be different from one another due to a structural characteristic or a process variable of the input and output circuit 114 or the memory interface 121. After the read training is completed, the controller 120 may store delays corresponding to a first boundary and a second boundary of a data signal having the shortest valid period.

For example, the controller 120 may store a delay (a broken line) corresponding to a first boundary of a data signal of the fifth data input and output line DQ5, of which the valid period is the shortest, or a delay (a dot-dash line) obtained by subtracting a delay corresponding to a margin from the relevant delay (the broken line), as a first verification value.

The controller 120 may store a delay (a broken line) corresponding to a second boundary of the data signal of the fifth data input and output line DQ5, of which the valid period is the shortest, or a delay (a dot-dash line) obtained by adding the delay corresponding to the margin and the relevant delay (the broken line), as a second verification value.

After the write training is completed, the controller 120 may store the first verification value and the second verification value. The controller 120 may verify whether delays of data signals are changed or distorted, by using the first verification value and the second verification value.

Figure 10:
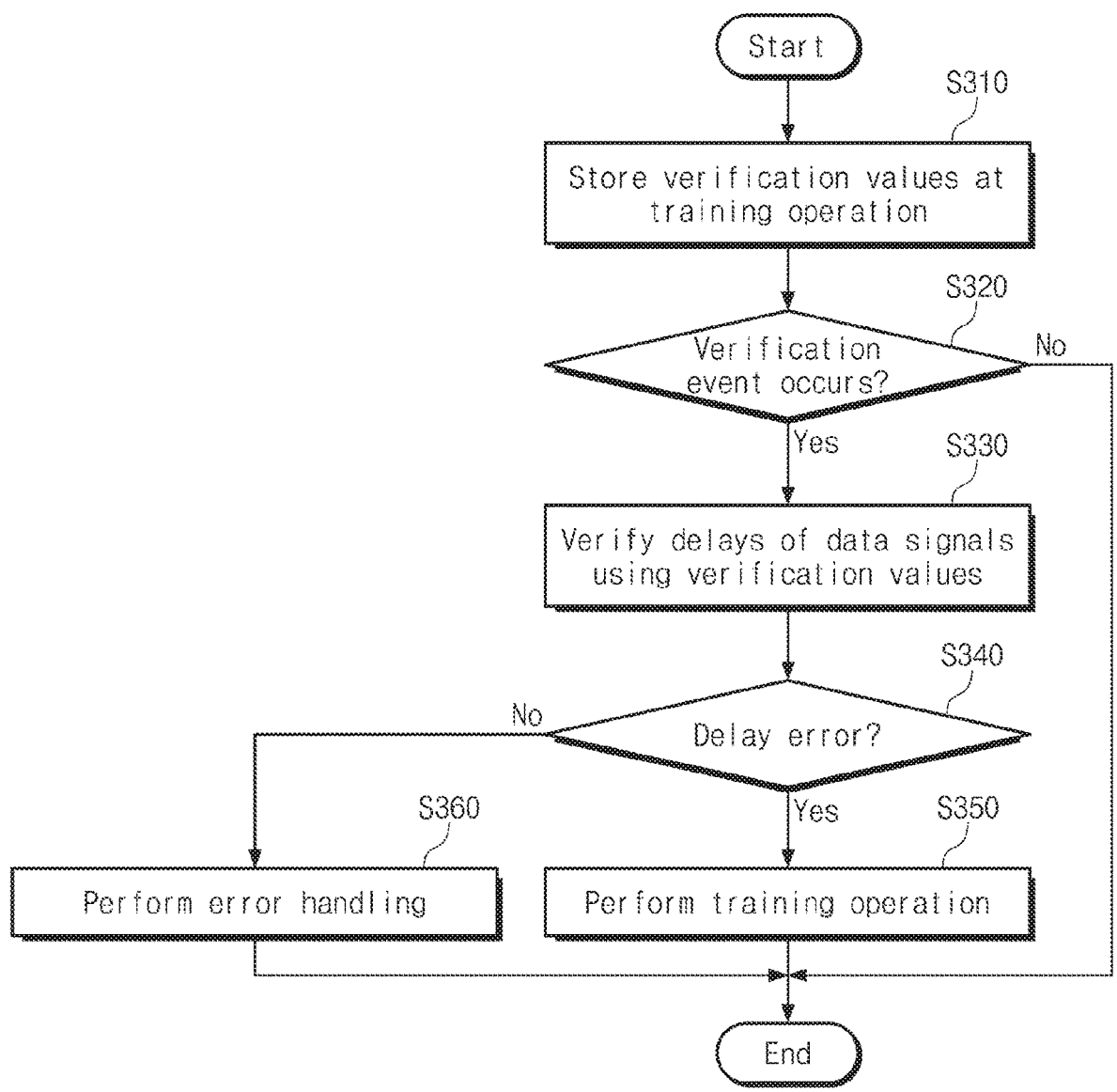
FIG. 10 is a flowchart illustrating a method in which the storage device of FIG. 1 verifies delays of data signals according to an exemplary embodiment of the inventive concept.

FIG. 10 is a flowchart illustrating a method in which the storage device of FIG. 1 verifies delays of data signals according to an exemplary embodiment of the inventive concept. Referring to FIGS. 1, 2, and 10, in operation S310, the controller 120 may store verification values (e.g., a first verification value and a second verification value) after a training operation (e.g., a read training or a write training) is completed.

In operation S320, the controller 120 may determine whether a verification event occurs. For example, when a read error occurs or when an error occurs upon transmitting data, the controller 120 may determine that the verification event occurs. Upon determination that the verification event does not occur, the process of FIG. 10 ends without verification. When the verification event occurs, operation S330 is performed.

In operation S330, the storage device 100 may verify delays of data signals by using the verification values. When it is determined in operation S340 that a delay error occurs, operation S350 is performed. In operation S350, the storage device 100 may again perform the training operation (e.g., the read training or the write training) and may again align the delays of the data signals.

When it is determined in operation S340 that a delay error does not occur, operation S360 is performed. In operation S360, the storage device 100 may perform error processing or handling. For example, the storage device 100 may execute a code given for processing an error, may reset a part of components, or may reset all the components.

Figure 11:
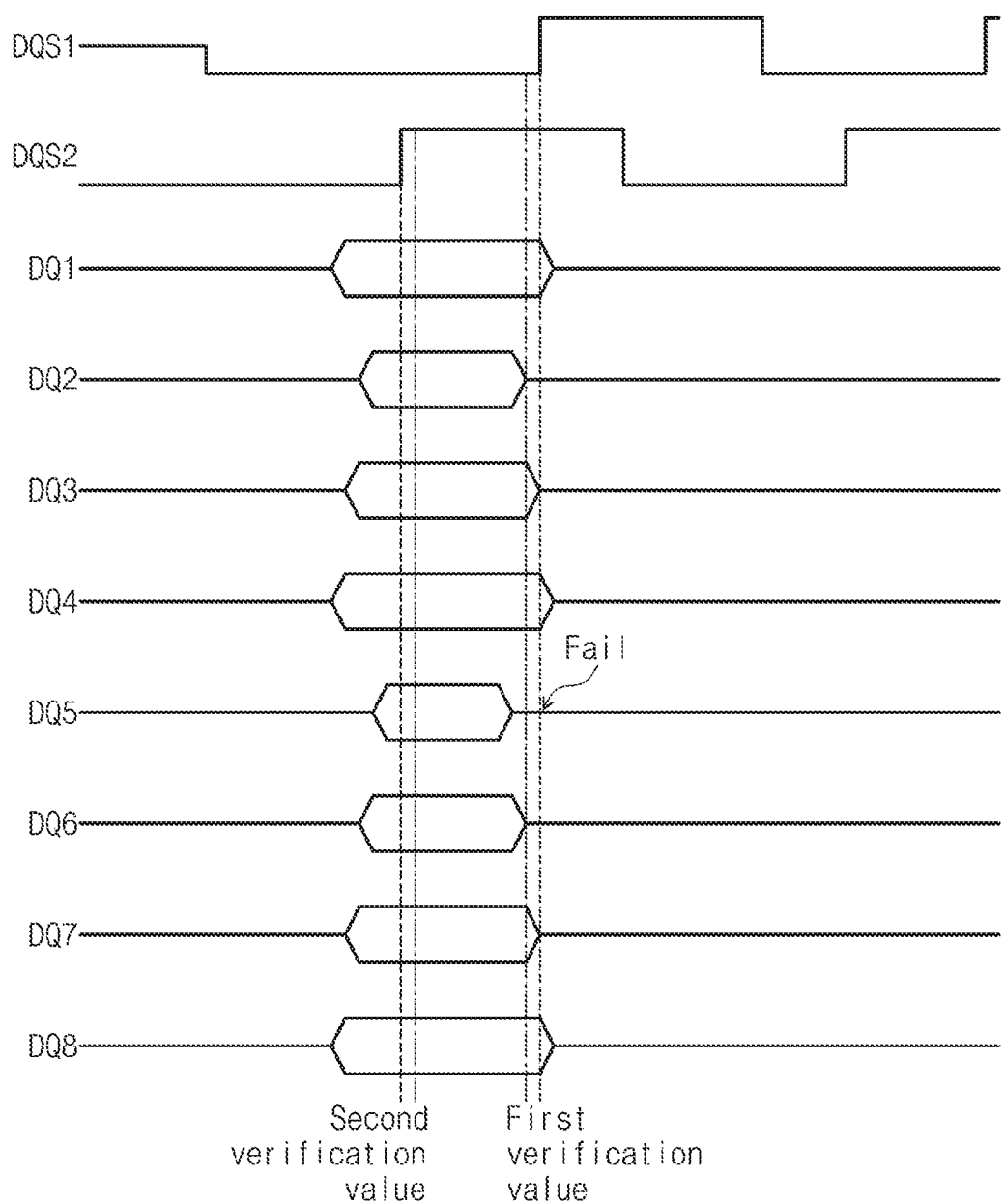
FIG. 11 illustrates an example in which delays of data signals are changed based on a result of comparing a first verification value and a second verification value according to an exemplary embodiment of the inventive concept.

FIG. 11 illustrates an example in which delays of data signals are changed based on a result of comparing a first verification value and a second verification value according to an exemplary embodiment of the inventive concept. Compared to FIG. 9, timings to transmit data signals may be advanced. When the verification event occurs, the nonvolatile memory device 110 or the controller 120 may set a delay of the data strobe signal DQS by using the first verification value and the second verification value and may determine whether data are transmitted accurately (or correctly).

In an exemplary embodiment of the inventive concept, an example in which the boundaries (the broken lines) of the fifth data input and output line DQ5 is used as the first and second verification values is illustrated in FIG. 11.

The nonvolatile memory device 110 or the controller 120 may adjust a delay of the data strobe signal DQS to the first verification value and may transmit a first data strobe signal DQS1 and data signals. In this case, the data signal of the fifth data input and output line DQ5 is not identified accurately (or correctly) at the controller 120 or the nonvolatile memory device 110. Delays of the data signals are advanced or increased when at least one of the data signals is not identified accurately.

The nonvolatile memory device 110 or the controller 120 may adjust the delay of the data strobe signal DQS to the second verification value and may transmit a second data strobe signal DQS2 and data signals. In this case, the data signals are identified accurately (or correctly) at the controller 120 or the nonvolatile memory device 110. Delays of the data signals are increased when at least one of the data signals is not identified accurately.

Figure 12:
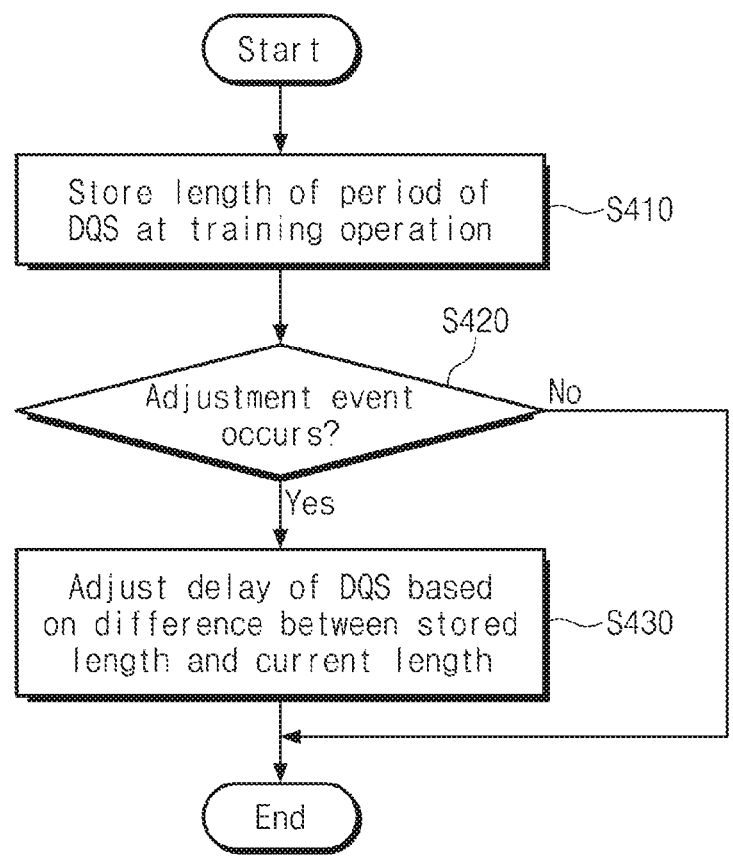
FIG. 12 is a flowchart illustrating an example in which the storage device of FIG. 1 adjusts a delay of a data strobe signal based on a variation of the data strobe signal according to an exemplary embodiment of the inventive concept.

FIG. 12 is a flowchart illustrating an example in which the storage device of FIG. 1 adjusts a delay of a data strobe signal based on a variation of the data strobe signal according to an exemplary embodiment of the inventive concept. Referring to FIGS. 1, 2, and 12, in operation S410, the controller 120 may store a length of one period of the data strobe signal DQS at a training operation.

In operation S420, the controller 120 may determine whether an adjustment event occurs. For example, when a length of one period of the data strobe signal DQS changes as much as a threshold or greater or when a temperature changes as much as a threshold or greater, the adjustment event may occur. Upon determination that the adjustment event does not occur, the process of FIG. 12 ends. When the adjustment event occurs, operation S430 is performed. In operation S430, the controller 120 may adjust a delay of the data strobe signal DQS based on a difference between the stored length and a current length of the data strobe signal DQS.

Figure 13:
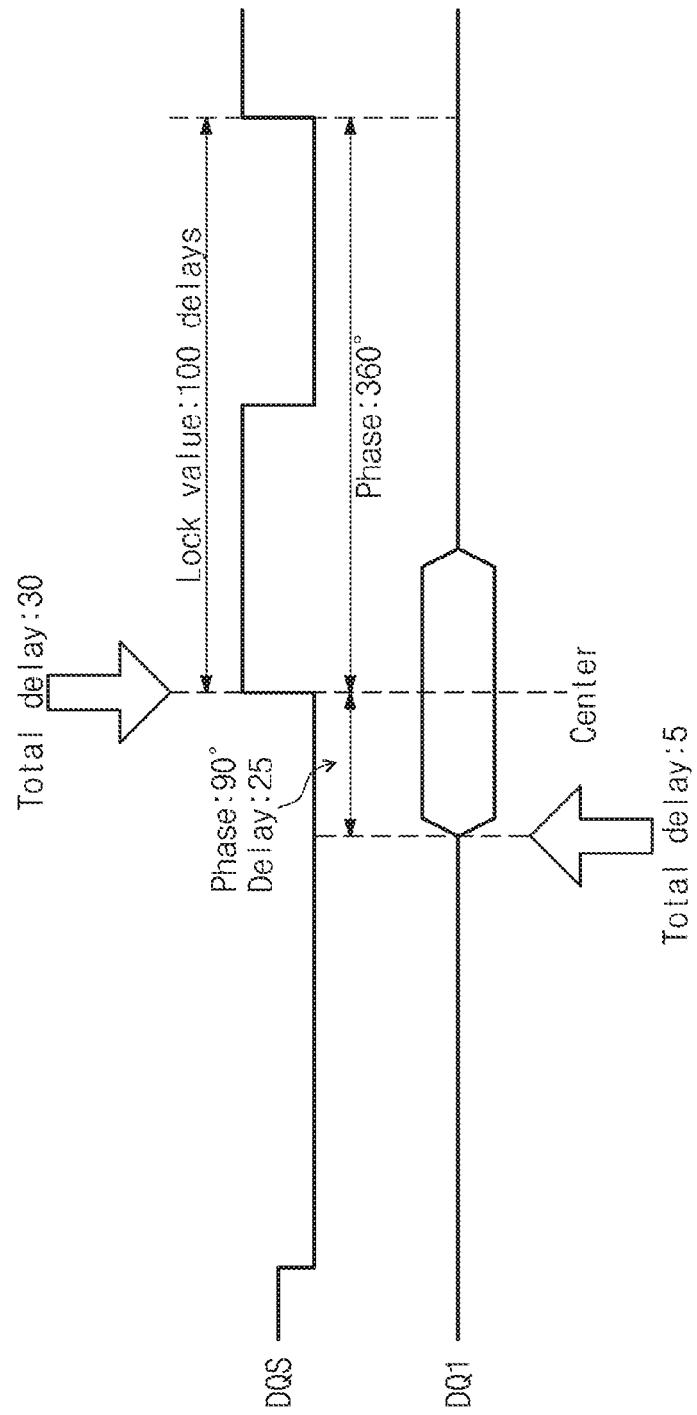
FIG. 13 illustrates an example in which the storage device of FIG. 1 measures a length of one period of a data strobe signal according to an exemplary embodiment of the inventive concept.

FIG. 13 illustrates an example in which the storage device of FIG. 1 measures a length of one period of a data strobe signal according to an exemplary embodiment of the inventive concept. Referring to FIGS. 1, 2, and 13, the controller 120 may measure a length of one period of the data strobe signal DQS as a lock value.

For example, the controller 120 may detect the number of delay units corresponding to one period of the data strobe signal DQS as the lock value. For example, when a training operation is performed, the lock value may be "100". In other words, one period of the data strobe signal DQS may be expressed as a delay of "100".

One period of the data strobe signal DQS may be expressed as a phase of 360°. In the case where the training operation is completed, the data strobe signal DQS may be delayed as much as 90° with respect to data signals, for example, a data signal of the first data input and output line DQ1. In the case where the data strobe signal DQS is delayed as much as 90°, a toggle timing of the data strobe signal DQS may be aligned with the center of the data signal.

For example, when the lock value of the data strobe signal DQS is "100", a delay between the data signal and the data strobe signal DQS may be adjusted to "25" corresponding to ¼ of "100". A timing when the data strobe signal DQS starts to transition may be determined according to a total delay of the data strobe signal DQS. For example, the total delay of the data strobe signal DQS may be "30". A timing when a data signal starts to be transmitted may be determined according to a delay of a data signal. For example, the delay of the data signal may be "5".

However, the data signal and the data strobe signal DQS may be misaligned as a length (or a frequency) of one period of the data strobe signal DQS changes.

Figure 14:
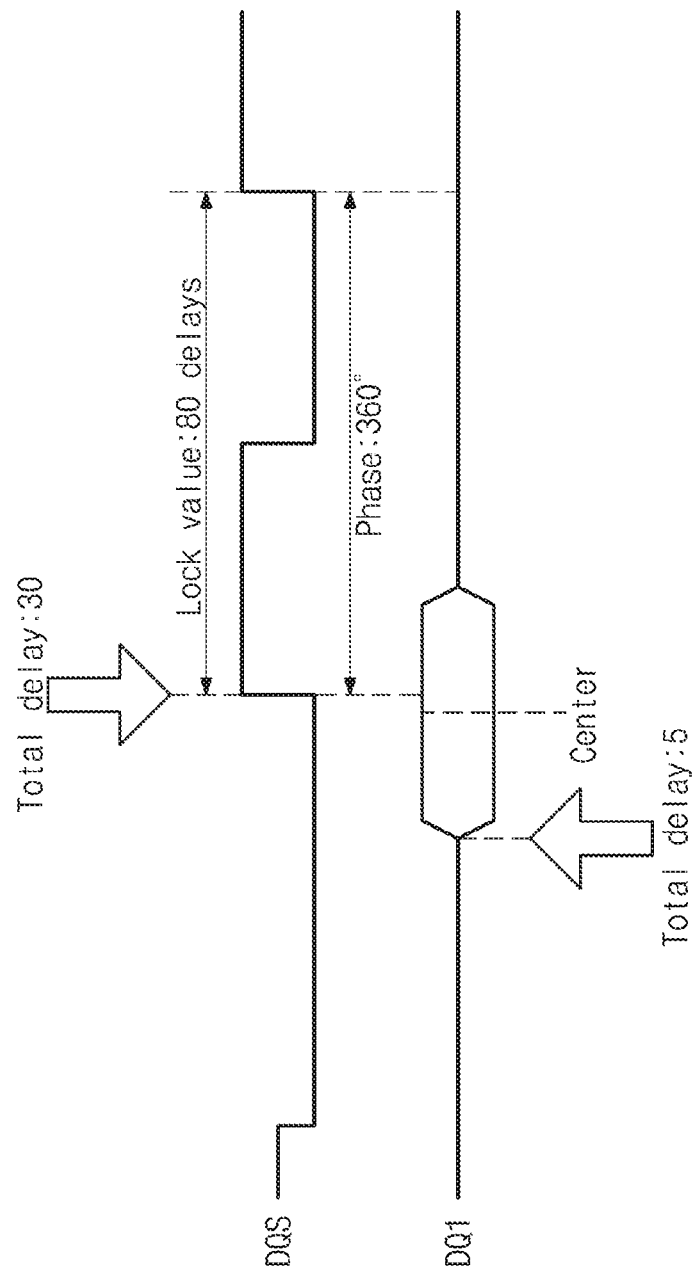
FIG. 14 illustrates an example in which a lock value of a data strobe signal decreases according to an exemplary embodiment of the inventive concept.

FIG. 14 illustrates an example in which a lock value of a data strobe signal decreases according to an exemplary embodiment of the inventive concept. Referring to FIGS. 1, 2, and 14, a lock value of the data strobe signal DQS decreases from "100" to "80". Valid periods of data signals, for example, a valid period of a data signal of the first data input and output line DQ1 may decrease at substantially the same rate as a rate at which the lock value of the data strobe signal DQS decreases.

Even though the lock value of the data strobe signal DQS decreases, a delay of the data strobe signal DQS and a delay of the data signal may be maintained. In other words, a timing when the data strobe signal DQS starts to transition may correspond to a delay of "30", and a timing when the data signal starts to be transmitted may correspond to a delay of "5". In this case, as illustrated in FIG. 14, a transition timing of the data strobe signal DQS and the center of the data signal may be misaligned.

Figure 15:
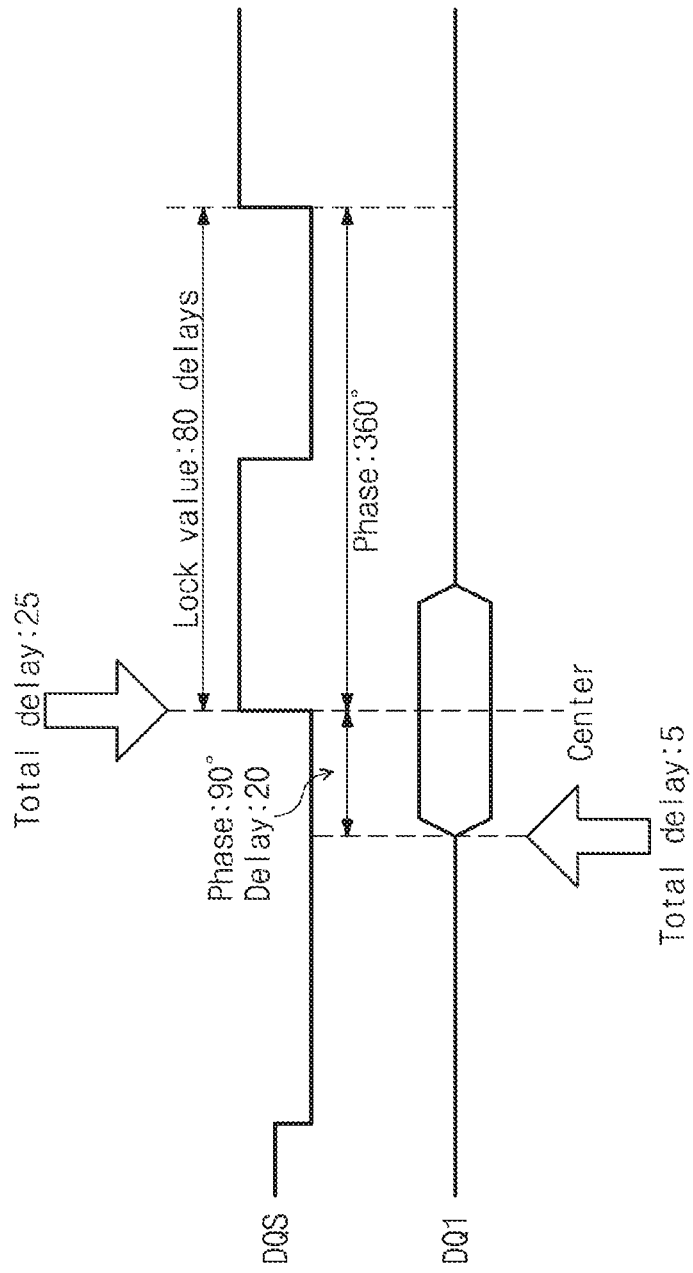
FIG. 15 illustrates an example of adjusting delays of data signals based on a variation of a data strobe signal according to an exemplary embodiment of the inventive concept.

FIG. 15 illustrates an example of adjusting delays of data signals based on a variation of a data strobe signal according to an exemplary embodiment of the inventive concept. Referring to FIGS. 1, 2, and 15, as a lock value of the data strobe signal DQS decreases as much as "20", a total delay of the data strobe signal DQS may decrease as much as "5" corresponding to ¼ of "20".

In the case where the delay of the data strobe signal DQS decreases as much as "5", a delay difference between the data strobe signal DQS and a data signal, for example, a data signal of the first data input and output line DQ1, may be "20". The delay of "20" may correspond to ¼ of a length of one period of the data strobe signal DQS and may correspond to a phase of 90°. Accordingly, the toggle timing of the data strobe signal DQS and the centers of data signals may be again aligned.

Figure 16:
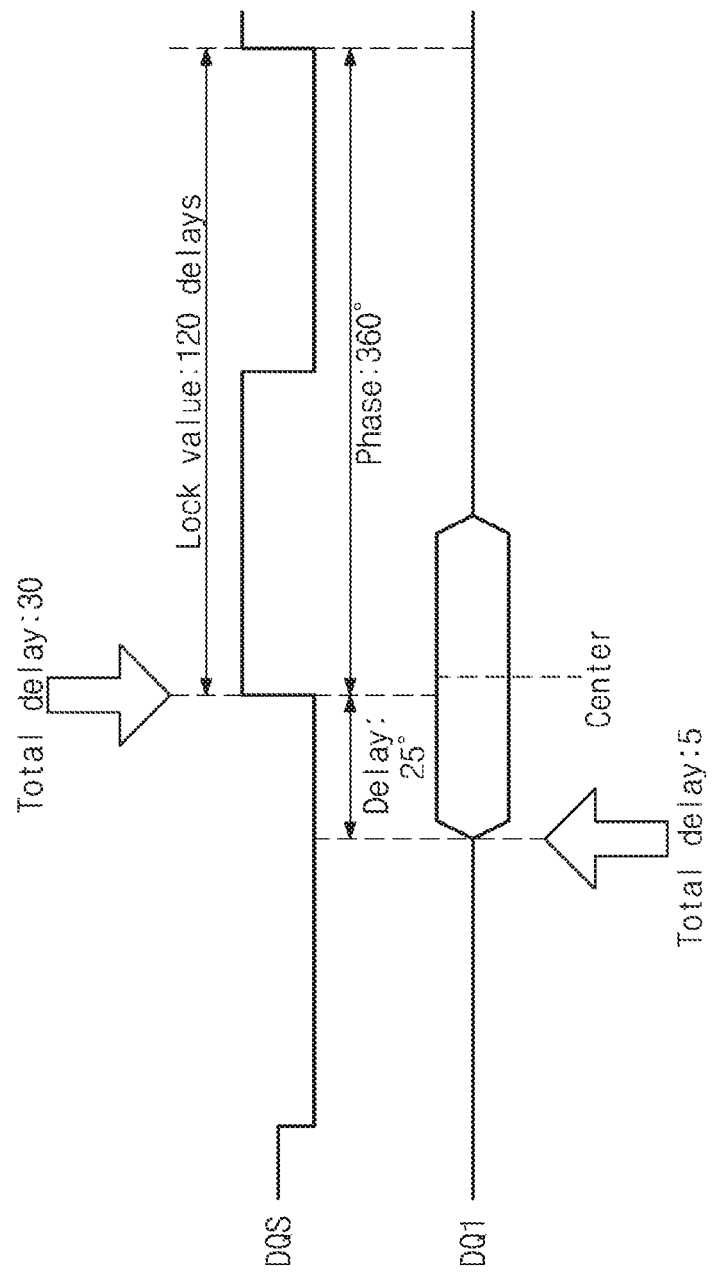
FIG. 16 illustrates an example in which a lock value of a data strobe signal increases according to an exemplary embodiment of the inventive concept.

FIG. 16 illustrates an example in which a lock value of a data strobe signal increases according to an exemplary embodiment of the inventive concept. Referring to FIGS. 1, 2, and 16, a lock value of the data strobe signal DQS increases from "100" to "120". Valid periods of data signals, for example, a valid period of a data signal of the first data input and output line DQ1 may increase at substantially the same rate as a rate at which the lock value of the data strobe signal DQS increases.

Even though the lock value of the data strobe signal DQS increases, a delay of the data strobe signal DQS and a delay of the data signal may be maintained. In other words, a timing when the data strobe signal DQS starts to transition may correspond to a delay of "30", and a timing when the data signal starts to transition may correspond to a delay of "5". In this case, as illustrated in FIG. 14, a transition timing of the data strobe signal DQS and the center of the data signal may be misaligned.

Figure 17:
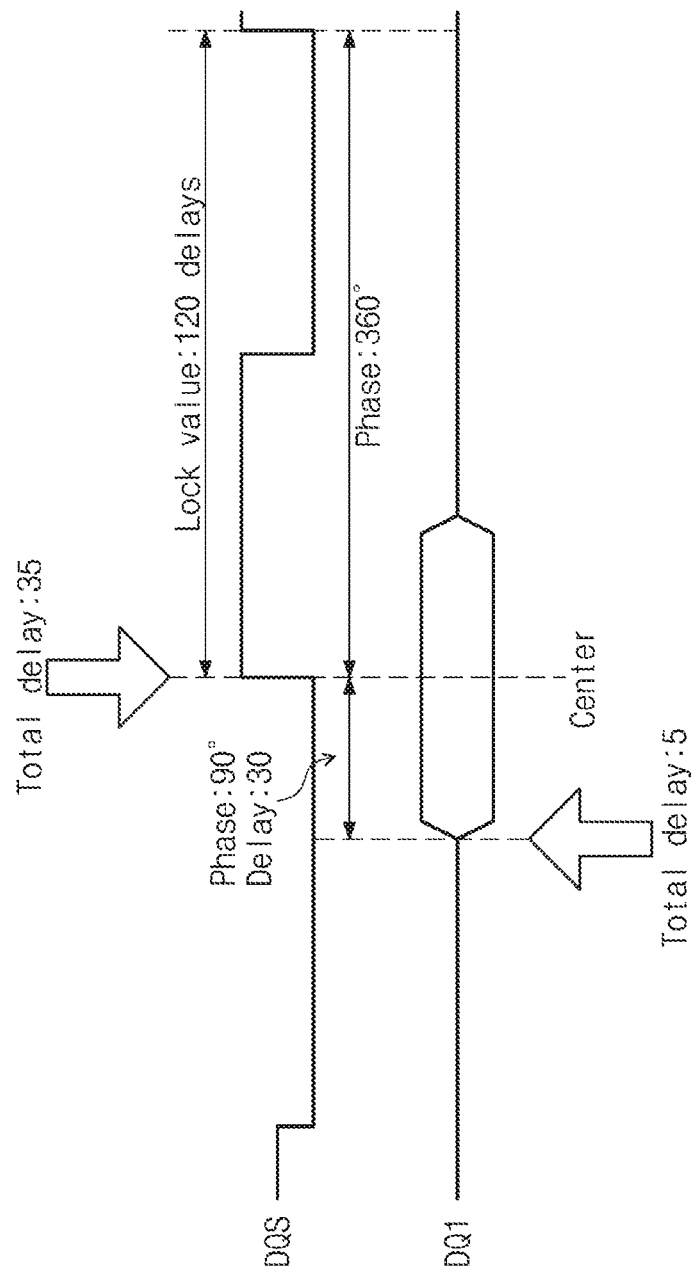
FIG. 17 illustrates an example of adjusting delays of data signals based on a variation of a data strobe signal according to an exemplary embodiment of the inventive concept.

FIG. 17 illustrates an example of adjusting delays of data signals based on a variation of a data strobe signal according to an exemplary embodiment of the inventive concept. Referring to FIGS. 1, 2, and 17, as a lock value of the data strobe signal DQS increases as much as "20", a total delay of the data strobe signal DQS may increase as much as "5" corresponding to ¼ of "20".

In the case where the delay of the data strobe signal DQS increases as much as "5", a delay difference between the data strobe signal DQS and a data signal, for example, a data signal of the first data input and output line DQ1, may be "30". The delay of "30" may correspond to ¼ of a length of one period of the data strobe signal DQS and may correspond to a phase of 90°. Accordingly, the toggle timing of the data strobe signal DQS and the centers of data signals may be again aligned.

A description is give with reference to FIGS. 13 to 17 where a delay of the data strobe signal DQS is adjusted based on a variation in a length (or a frequency) of one period of the data strobe signal DQS. However, instead of the data strobe signal DQS, delays of data signals may be adjusted in common.

For example, when a delay of the data strobe signal DQS needs to decrease as much as "5" (refer to FIGS. 14 and 15), instead of the data strobe signal DQS, delays of data signals may increase as much as "5". When a delay of the data strobe signal DQS needs to increase as much as "5" (refer to FIGS. 16 and 17), instead of the data strobe signal DQS, delays of the data signals may decrease as much as "5".

As described above, the storage device 100 according to exemplary embodiments of the inventive concept may perform the training operation with the first stride and the second stride. Accordingly, a time necessary for the training operation decreases. Additionally, the storage device 100 according to exemplary embodiments of the inventive concept may verify delays of data signals with the first verification value and the second verification value. Accordingly, the reliability of the storage device 100 is improved.

Additionally, the storage device 100 according to exemplary embodiments of the inventive concept may dynamically adjust a delay of the data strobe signal DQS based on a variation in a length (or a frequency) of a period of the data strobe signal DQS. Accordingly, in the case where the length (or frequency) of the period of the data strobe signal DQS changes intentionally or unintentionally, data signals and the data strobe signal DQS may be aligned without again performing the training operation.

In the above exemplary embodiments of the inventive concept, components are described by using blocks. The blocks may be implemented with various hardware devices, such as an integrated circuit, an application specific IC (ASIC), a field programmable gate array (FPGA), or a complex programmable logic device (CPLD), firmware driven in hardware devices, software such as an application, or a combination of a hardware device and software. Additionally, the blocks may include circuits or intellectual property (IP) implemented with semiconductor elements in an integrated circuit.

According to exemplary embodiments of the inventive concept, a training operation is performed by using a coarse training using a first stride and a fine training using a second stride. Additionally, verification values are stored after the training operation is completed, and whether delays of data signals are changed is verified by using verification values. In addition, as one period of a data strobe signal changes, the delays of the data signals are adjusted. Accordingly, a storage device which performs the training operation with a reduced time, and verifies and dynamically adjusts the delays of the data signals is provided.

While the inventive concept has been described with reference to exemplary embodiments thereof, it will be apparent to those of ordinary skill in the art that various changes and modifications in form and details may be made thereto without departing from the spirit and scope of the inventive concept as set forth in the following claims.

What is claimed is:

1. A storage device comprising:
a nonvolatile memory device; and
a controller configured to exchange a data signal with the nonvolatile memory device through a data input and output line and to exchange a data strobe signal with the nonvolatile memory device through a data strobe line,
wherein, in a training operation, at least one of the nonvolatile memory device and the controller is configured to perform a coarse training of adjusting a delay of the data signal with a first stride and a fine training of adjusting the delay of the data signal with a second stride smaller than the first stride.

2. The storage device of claim 1, wherein the training operation includes a read training,
wherein, in the read training, the nonvolatile memory device transmits the data signal and the data strobe signal to the controller while adjusting the delay of the data signal,
wherein the controller identifies the data signal in synchronization with the data strobe signal by latching the data signal as latched data bits,
wherein, while the data signal is not accurately identified at the controller, the nonvolatile memory device transmits the data signal and the data strobe signal to the controller while increasing the delay of the data signal as much as the first stride, and
wherein the data signal is accurately identified when the latched data bits are matched with particular data bits.

3. The storage device of claim 2, wherein, when the data signal is accurately identified for a first time at the controller, the nonvolatile memory device decreases the delay of the data signal as much as the first stride, increases the delay of the data signal as much as the second stride, and transmits the data signal and the data strobe signal to the controller.

4. The storage device of claim 3, wherein, after the nonvolatile memory device increases the delay as much as the second stride, while the data signal is not accurately identified at the controller, the nonvolatile memory device increases the delay of the data signal as much as the second stride and transmits the data signal and the data strobe signal to the controller.

5. The storage device of claim 4, wherein, after the fine training of increasing the delay of the data signal as much as the second stride starts, when the data signal is accurately identified for a first time at the controller, the controller identifies a boundary of the data signal.

6. The storage device of claim 1, wherein the training operation includes a read training,
wherein, in the read training, the nonvolatile memory device transmits the data signal and the data strobe signal to the controller while adjusting the delay of the data signal,
wherein the controller identifies the data signal in synchronization with the data strobe signal by latching the data signal as latched data bits,
wherein, while the data signal is accurately identified at the controller, the nonvolatile memory device transmits the data signal and the data strobe signal to the controller while increasing the delay of the data signal as much as the first stride, and
wherein the data signal is accurately identified when the latched data bits are matched with particular data bits.

7. The storage device of claim 6, wherein, when the data signal is not accurately identified for a first time at the controller, the nonvolatile memory device decreases the delay of the data signal as much as the first stride, increases the delay of the data signal as much as the second stride, and transmits the data signal and the data strobe signal to the controller.

8. The storage device of claim 1, wherein the training operation includes a write training,
wherein, in the write training, the controller transmits the data signal and the data strobe signal to the nonvolatile memory device while adjusting the delay of the data signal, and receives a second data signal corresponding to the data signal and a second data strobe signal from the nonvolatile memory device,
wherein the controller identifies the second data signal in synchronization with the second data strobe signal by latching the second data signal as latched data bits,
wherein, while the second data signal is not accurately identified at the controller, the controller transmits the data signal and the data strobe signal to the nonvolatile memory device while increasing the delay of the data signal as much as the first stride, and receives the second data signal corresponding to the data signal and the second data strobe signal from the nonvolatile memory device,
wherein, when the second data signal is accurately identified for a first time at the controller, the controller decreases the delay of the data signal as much as the first stride, increases the delay of the data signal as much as the second stride, transmits the data signal and the data strobe signal to the nonvolatile memory device, and receives the second data signal and the second data strobe signal from the nonvolatile memory device, and wherein the second data signal is accurately identified when the latched data bits are matched with particular data bits.

9. The storage device of claim 1, wherein the training operation includes a write training, wherein, in the write training, the controller transmits the data signal and the data strobe signal to the nonvolatile memory device while adjusting the delay of the data signal, and receives a second data signal corresponding to the data signal and a second data strobe signal from the nonvolatile memory device, wherein the controller identifies the second data signal in synchronization with the second data strobe signal, wherein, while the second data signal is accurately identified at the controller, the controller transmits the data signal and the data strobe signal to the nonvolatile memory device while increasing the delay of the data signal as much as the first stride, and receives the second data signal corresponding to the data signal and the second data strobe signal from the nonvolatile memory device, and wherein, when the second data signal is not accurately identified for a first time at the controller, the controller decreases the delay of the data signal as much as the first stride, increases the delay of the data signal as much as the second stride, transmits the data signal and the data strobe signal to the nonvolatile memory device, and receives the second data signal and the second data strobe signal from the nonvolatile memory device.

* * * * *